United States Patent [19]
Ema

[11] Patent Number: 5,763,910
[45] Date of Patent: Jun. 9, 1998

[54] SEMICONDUCTOR DEVICE HAVING A THROUGH-HOLE FORMED ON DIFFUSED LAYER BY SELF-ALIGNMENT

[75] Inventor: Taiji Ema, Kawasaki, Japan

[73] Assignee: Fujitsu Limited, Kawasaki, Japan

[21] Appl. No.: 715,327

[22] Filed: Sep. 18, 1996

Related U.S. Application Data

[63] Continuation-in-part of Ser. No. 592,481, Jan. 26, 1996.

[30] Foreign Application Priority Data

Jan. 31, 1995 [JP] Japan ......... 7-13748
Nov. 29, 1995 [JP] Japan ......... 7-310737

[51] Int. Cl.$^6$ ......... H01L 27/108
[52] U.S. Cl. ......... 257/296; 257/301; 257/307; 257/308; 257/903; 438/254; 438/397
[58] Field of Search ......... 257/296, 307, 257/308, 903, 301; 437/47, 52, 919; 438/254, 397

[56] References Cited

U.S. PATENT DOCUMENTS 5,384,276  1/1995  Ogawa et al. ......... 437/52
5,498,889  3/1996  Hayden ......... 257/301

FOREIGN PATENT DOCUMENTS 4-69970  3/1992  Japan ......... 257/903

*Primary Examiner*—Valenica Martin Wallace
*Attorney, Agent, or Firm*—Armstrong, Westerman, Hattori, McLeland, & Naughton

[57] ABSTRACT

The present invention relates to a semiconductor device whose through-holes are formed by self-alignment and a method for fabricating the same. The through-holes formed on the gate electrodes can be formed simultaneously with SACs without complicating the fabrication process. The semiconductor device comprises a semiconductor substrate, a device isolation film defining devices regions on the semiconductor substrate, a pair of diffused layers formed in the device regions, gate electrodes formed through a first insulation film on the semiconductor substrate between the pair of diffused layers, and an etching stopper film covering side walls of the gate electrodes and parts of top surfaces of the gate electrodes which are extended inward by a prescribed distance from peripheral edges thereof. Whereby through-holes of an SAC structure can be formed in a later step, and the through-holes can be formed to expose the gate electrodes without removing the etching stopper film.

10 Claims, 17 Drawing Sheets

SEMICONDUCTOR DEVICE HAVING A THROUGH-HOLE FORMED ON DIFFUSED LAYER BY SELF-ALIGNMENT

CROSS-REFERENCE TO RELATED APPLICATION

This application is a continuation-in-part of application Ser. No. 08/592,481 filed on Jan. 26, 1996.

BACKGROUND OF THE INVENTION

The present invention relates to a method for fabricating a semiconductor device, more specifically to a semiconductor device having a through-hole formed on the source/drain diffused layer of a MOS transistor by self-alignment with the gate electrode, and a method for fabricating the same.

As LSIs increase their scales, further micronization of the devices is sought. To realize further micronized semiconductor integrated circuits having gates, wirings, and through-holes of further micronized dimensions, exposure wavelengths of photolithography have been shortened to improve resolution.

While a minimum resolution dimension is thus made decreased, various device structures which allow alignment margins for alignment between lithography steps are studied, and an attempt is made to decrease device dimensions themselves without diminishing dimensions of patterns to be transferred.

Such a device structure is exemplified by self-aligned contact (hereinafter called SAC).

The conventional SAC will be explained with reference to FIG. 16.

A device isolation film 12 is formed on a silicon substrate 10, defining device regions 14 and 16. Gate electrodes 26 are formed on the silicon substrate in the device regions 14 and 16 through a gate oxide film 18. The gate electrodes 26 have their side walls and the top surfaces covered with an etching stopper film 36 of silicon nitride film. A source/drain diffused layer 28 is formed on the device regions 14 and 16 on both sides of the gate electrodes 26. MOS transistors comprising the gate electrodes 26, and the source/drain diffused layers 28 are thus formed.

An inter-layer insulation film 38, of e.g. BPSG (Boro-Phospho-Silicate Glass) film, formed on the silicon substrate 10 with the MOS transistors. In the inter-layer insulation film 38 there are formed through-holes 42, 44, and 48 exposing the source/drain diffused layer 28, and through-holes 46 exposes the gate electrodes 26. Of these through-holes 42 and 44 are the so-called SACs.

Then the method for forming the through-holes of SAC will be explained with reference to FIG. 17A.

After the MOS transistors having the gate electrodes 26 covered with the etching stopper film 36 are formed on the silicon substrate 10, the inter-layer insulation film 38 of BPSG film is formed.

Then a photoresist 40 having a pattern of the through-holes to expose the source/drain diffused layer 28, is formed; and with the photoresist 40 acting as a mask, the inter-layer insulation film 38 is etched.

At this time, the gate electrodes covered with the etching stopper film are present, in the regions that the through-holes 42 and 44 are formed into; however the etching stopper film 36 is not substantially etched when a sufficiently high selectivity ratio with respect to silicon nitride film as a condition for etching the inter-layer insulation film 38, is used. The through-holes 42 and 44 are able to expose the source/drain diffused layer 28 (FIG. 17A).

The through-holes 42 and 44, to expose the source/drain diffused layer 28, are thus formed in alignment with the position of the etching stopper film 36. This is why the through-holes 42 and 44 are called SACs.

The use of such an SAC structure allows the pattern of the through-holes 42 and 44 to be laid on the regions containing the gate electrodes 26. Even when the openings of the through-holes are a little displaced, the through-holes can be formed in alignment with the etching stopper film. Therefore, the alignment precision can be less strict.

Highly integrated semiconductor devices using SACs have thus been fabricated.

However, the above-described semiconductor device fabrication method using SACs cannot form the through-holes 46 which are to expose the gate electrodes concurrent with the through-holes 42, 44, and 48.

This limitation exists because, in the conventional SAC technique, when the through-holes 42, 44, 46, and 48 are concurrently formed by self-alignment using the silicon nitride film covering the gate electrodes 26 as the etching stopper film 36, the etching stopper film 36 covering the gate electrodes 26 adversely remains in the through-holes 46 after the through-holes 42, 44, and 48, in which the source/drain diffused layer 28 is to be exposed, are formed.

Accordingly, to form the through-holes 46 exposing the gate electrodes 26, it is necessary to separately remove the etching stopper film 36. Thus, it is necessary to add one lithography step, as exemplified in FIG. 17B.

SUMMARY OF THE INVENTION

An object of the present invention is to provide a semiconductor device and a method for fabricating the same which can form the through-holes, that expose the gate electrodes, simultaneously with the SACs, without complicating the fabrication process.

The above-described object is achieved by a semiconductor device comprising: a semiconductor substrate; a device isolation film defining device region on the semiconductor substrate; a pair of diffused layers formed in the device region; a gate electrode formed through a first insulation film on the semiconductor substrate between the pair of the diffused layers; and an etching stopper film covering side walls of the gate electrode and a part of top surface of the gate electrode which is extended inward by a prescribed distance from peripheral edges thereof, whereby through-holes of an SAC structure can be formed in a later step, and the through-holes can be formed to expose the gate electrode without removing the etching stopper film.

In the above-described semiconductor device, it is preferred that the semiconductor device further comprises: a second insulation film formed on the semiconductor substrate with the etching stopper film formed thereon, and having a first through-hole formed on the diffused layer and a second through-hole formed on the gate electrode in the region without the etching stopper film formed thereon; and a wiring layer connected to the diffused layer or the gate electrode through the first through-hole or the second through-hole, whereby the first and the second through-holes can be formed in only one lithography step. In comparison with the conventional SAC process, one lithography step can be omitted.

In the above-described semiconductor device, it is preferred that the semiconductor device further comprises a metal silicide film formed on the gate electrode in the region without the etching stopper film formed thereon, and on the diffused layer, whereby improved contact characteristics can be obtained on the surface of the gate electrode and the diffused layer.

In the above-described semiconductor device, it is preferred that the device isolation film is formed of the same material as the etching stopper film, whereby even in a case that the through-holes are extended onto the device isolation film, the through-holes can be formed without etching the device isolation film. Accordingly the through-holes can be formed by self-alignment with the etching stopper film and the device isolation film.

In the above-described semiconductor device, it is preferred that the device isolation film and the etching stopper film are formed of silicon nitride film.

The above-described object can be achieved also by a semiconductor device comprising on a semiconductor substrate a word line extended to a first direction, a bit line extended to a second direction intersecting the first direction, and a memory cell disposed in a region of a intersection between the word line and the bit line, the memory cell comprising: a device isolation film defining device region on the semiconductor substrate; a pair of diffused layers formed on the device region; a gate electrode functioning also as the word line formed on the semiconductor substrate between the pair of diffused layers through a first insulation film; and an etching stopper film covering side walls of the gate electrode and a part of top surface of the gate electrode which is extended inward by a prescribed distance from peripheral edges thereof, whereby through-holes of an SAC structure can be formed in a later step, and the through-holes can be formed on the gate electrode without removing the etching stopper film.

In the above-described semiconductor device, it is preferred that the gate electrode formed on the device region has a larger line width than the gate electrode formed on the device isolation film.

In the above-described semiconductor device, it is preferred that the etching stopper film formed on the device isolation film has a region covering an entire surface of the gate electrode. These structures of the semiconductor device allow the through-hole to be formed in a wide region including the gate electrode belonging to the region. Capacitor storage electrode are formed using the inside walls of the through-hole, whereby large capacitor areas can be obtained.

The above-described object can be achieved by a method for fabricating a semiconductor device comprising: a device isolating step of forming, on a semiconductor substrate, a device isolation film for defining a device region; a first insulation film forming step of forming a first insulation film on the semiconductor substrate with the device isolation film formed thereon; a gate electrode forming step of forming a gate electrode on the first insulation film; an etching stopper film forming step of forming an etching stopper film on the semiconductor substrate with the gate electrode formed thereon, covering side walls of the gate electrode and a part of top surface of the gate electrode which is extended inward by a prescribed distance from peripheral edges thereof; a second insulation film forming step of forming a second insulation film having different etching characteristics from the etching stopper film on the semiconductor substrate with the etching stopper film formed thereon; and a through-hole forming step of simultaneously forming, in the second insulation film, a first through-hole for exposing the device region in a region without the gate electrode formed therein, and a second through-hole for exposing the gate electrode in a region without the etching stopper film formed therein, whereby the first through-hole formed on the device region, and the second through-hole formed on the gate electrode can be formed by one lithography step. In comparison with the conventional fabrication process, one lithography step can be omitted.

In the above-described method for fabricating a semiconductor device, it is preferred that the method further comprises: the silicide film forming step of selectively forming a silicide film, after the etching stopper film forming step, on the gate electrode in the region without the etching stopper film formed therein, and on the diffused layer, whereby contact characteristics on the surface of the gate electrode and the diffused layer can be improved. The etching stopper film prevents abnormal reaction in the silicidation, so that a short-circuit between the gate electrode and the source/drain diffused layer can be prevented.

In the above-described method for fabricating a semiconductor device, it is preferred that in the through-hole opening step, the second insulation film is etched with the etching stopper film as an etching stopper to form the first through-hole formed by alignment with the etching stopper film, whereby the usual SAC technique can be used to form the first through-hole.

In the above-described method for fabricating a semiconductor device, it is preferred that in the device isolating step, the device isolation film is formed of a substance having different etching characteristics from the etching stopper film; in the through-hole forming step, the second insulation film is etched with the etching stopper film and the device isolation film as an etching stopper to form the first through-hole by alignment with the etching stopper film and the device isolation film, whereby the first through-hole can be formed without etching the device isolation film. The through-holes can be laid out so as to be extended onto the device isolation film, which enables further integration of the semiconductor device.

In the above-described method for fabricating a semiconductor device, it is preferred that the gate electrode forming step comprises: a conducting film forming step of forming, on the first insulation film, a conducting film to be the gate electrode; a third insulation film forming step of forming, on the conducing film, a third insulation film having substantially the same etching characteristics as the second insulation film; a fourth insulation film forming step of forming a fourth insulation film having etching characteristics different from the second insulation film; and a patterning step of processing the fourth insulation film, the third insulation film, and the conducting film, into the same pattern to form the gate electrode of the conducting film, and the etching stopper film forming step comprises: a first etching step of isotropically etching the third insulation film to etch the third insulation film horizontally by a prescribed distance, a fifth insulation film forming step of forming a fifth insulation film having etching characteristics different from the second insulation film so that spaces formed by etching the third insulation film are buried; and a second etching step of vertically etching the fourth and the fifth insulation films until the third insulation film is exposed, the etching stopper film is formed of the fifth insulation film, whereby the etching stopper can be formed on the side walls of the gate electrode and on the part of the top surface thereof which is extended inward by a prescribed distance from the peripheral edges thereof.

In the above-described method for fabricating a semiconductor device, it is preferred that in the patterning step, the gate electrode having a first region having a first line width, and a second region having a second line width which is smaller than the first line width is formed; and in the first etching step, the third insulation film on the second region of the gate electrode is completely removed, the etching stopper film covering side walls of the gate electrode in the first region, a part of top surface of the gate electrode in the first region which is extended inward by a prescribed distance from peripheral edges thereof, and side walls and a top surface of the gate electrode in the second region is formed, whereby the etching stopper can cover the side walls of the gate electrode in the first region, the part of the top surface of the gate electrode in the first region, which is extended inward by a prescribed distance from the peripheral edges thereof, and the side walls and the top surface of the gate electrode in the second region.

In the above-described method for fabricating a semiconductor device, it is preferable that the third insulation film is formed of a substance having a higher etching rate than the device isolation film or the etching stopper film, whereby the through-holes can form without reduction of the film thickness of the insulation film and the fourth insulation film.

In the above-described method for fabricating a semiconductor device, it is preferred that the gate electrode forming step comprises: a conducting film forming step of forming, on the first insulation film, a conducting film to be the gate electrode; a third insulation film forming step of depositing, on the conducting film, a third insulation film having substantially the same etching characteristics as the second insulation film and patterning the third insulation film; and a first side wall forming step of depositing on the third insulation film the fourth insulation film having etching characteristics different from the second insulation film and vertically etching the fourth insulation film to form first side walls of the fourth insulation film on side walls of the third insulation film; and the patterning step of etching the conducting film with the third insulation film and the first side walls acting as a mask to form the gate electrode of the conducting film, and the etching stopper film forming step comprises: a second side wall forming step of depositing, on the semiconductor substrate with the third insulation film and the first side walls formed on, the fifth insulation film having etching characteristics different form the second insulation film and vertically etching the fifth insulation film to form the second side walls of the fifth insulation film on side walls of the gate electrode and of the first side walls, the etching stopper film is formed of the first side walls and the second side walls, whereby the etching stopper film covering the side walls of the gate electrode, and the part of the top surface thereof, which is extended inward by a prescribed distance from the peripheral edges can be formed of the first side walls and the second side walls.

In the above-described method for fabricating a semiconductor device, it is preferred that in the device isolating step, a sixth insulation film having etching characteristics different form the second insulation film is deposited and patterned to form the device isolation film of the sixth insulation film, whereby the device isolation film is kept from being etched during the formation of the through-holes. The device isolation film can be used as a mask for the etching, and the through-holes can be formed by self-alignment with the device isolation film.

In the above-described method for fabricating a semiconductor device, it is preferred that the device isolation film and the etching stopper film are formed of silicon nitride film.

In the above-described method for fabricating a semiconductor device, it is preferred that the second insulation film and the third insulation film are formed of silicon oxide film or doped silicon oxide film.

DETAILED DESCRIPTION OF THE INVENTION

[A First Embodiment]

The semiconductor device according to a first embodiment of the present invention and the method for fabricating the same will be explained with reference to FIGS. 1, 2A–2C, and 3A–3B.

Figure 1:
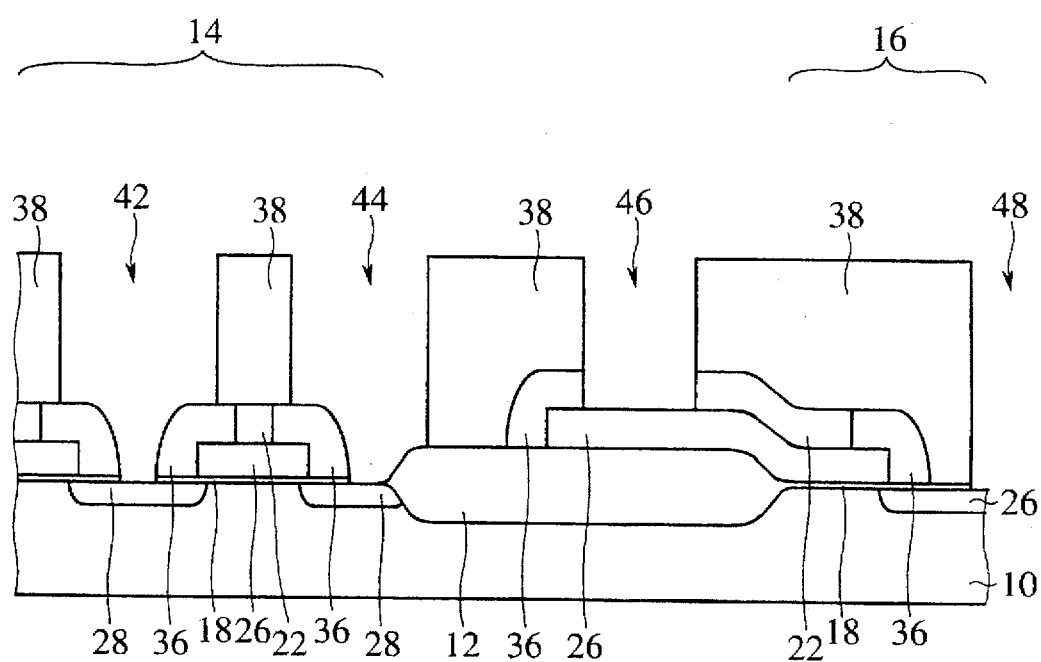
FIG. 1 is a diagrammatic sectional view of the semiconductor device according to a first embodiment of the present invention, which shows a structure thereof.

FIG. 1 is a diagrammatic sectional view of the semiconductor device according to the first embodiment of the present invention, and FIGS. 2A–2C and 3A–3B are sectional views of the semiconductor device according to the present embodiment at different steps of the fabrication process of the same, which explains the method.

First, a structure of the semiconductor device according to the present embodiment will be explained with reference to FIG. 1.

A device isolation film 12 for defining the device regions 14 and 16 is formed on a silicon substrate 10. In the device regions 14 and 16 gate electrodes 26 are formed through a gate oxide film 18. A source/drain diffused layer 28 is formed in the device regions 14 and 16 on both sides of the gate electrodes 26. Thus, MOS transistors, which include the gate electrodes 26 and the source/drain diffused layer 28, are formed.

An inter-layer insulation film 38 is formed on the silicon substrate 10 with the MOS transistors. Through-holes 42, 44, 46, and 48, which reach the source/drain diffused layer 28 and the gate electrodes 26, are formed in the inter-layer insulation film 38.

The semiconductor device according to the present embodiment is characterized by an etching stopper film 36, formed on the side walls of the gate electrodes 26 and parts of the top surfaces of the gate electrodes 26 which are extended inward by a set distance from the peripheral edges thereof.

This arrangement of the etching stopper film 36 facilitates the fabrication process of the semiconductor device.

Then, the fabrication process of the semiconductor device, according to the present embodiment, will be explained with reference to FIGS. 2A–2C and 3A–3B.

First, the device isolation film 12, with a thickness of an about 300 nm, is formed on the primary surface of the silicon substrate 10, using e.g. the usual LOCOS technique. Then, the gate oxide film 18, with a thickness of about 10 nm, is formed on the device regions 14 and 16 by thermal oxidation.

Subsequently, an approximately 200 nm thick polycrystalline silicon film 20 heavily doped with P (phosphorus), an approximately 100 nm thick PSG (Phospho-silicate Glass) film 22, and an approximately 20 nm thick silicon nitride film 24, are continuously deposited by CVD (Chemical Vapor Deposition) technique, plasma CVD technique and thermal CVD technique, respectively.

Then, the silicon nitride film 24, the PSG film 22, and the polycrystalline silicon film 20, are simultaneously patterned by the usual lithography and etching techniques. Thus, the gate electrodes 26, having the top surfaces covered with the PSG film 22 and the silicon nitride film 24, are formed.

Figure 2A:
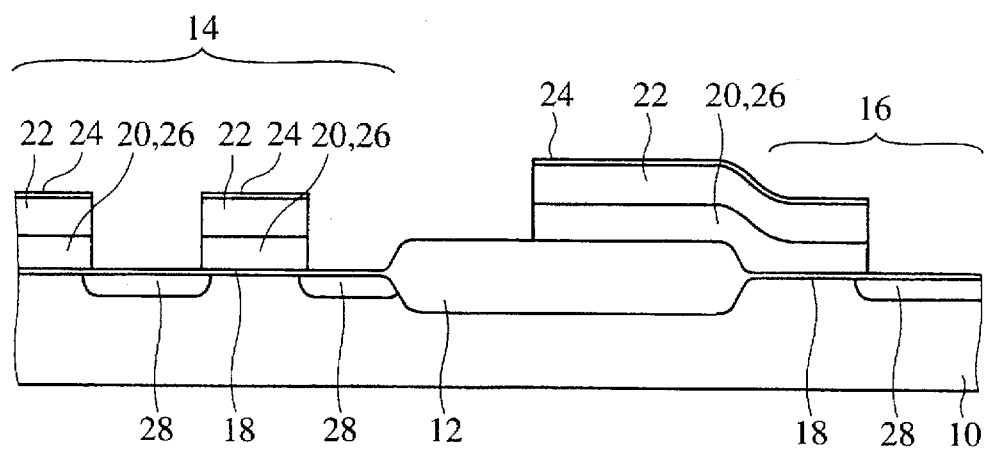
FIGS. 2A–2C are sectional views of the semiconductor device, according to the first embodiment of the present invention at different steps of the fabrication process of the same, which shows the method (Part 1).

Next, P ions (for example), are implanted with the gate electrodes, to act as a mask, under the conditions of a 30 keV acceleration energy and a $2\times10^{-}$ cm$^{-2}$ dose, to form the source/drain diffused layer 28 (FIG. 2A).

Figure 2B:
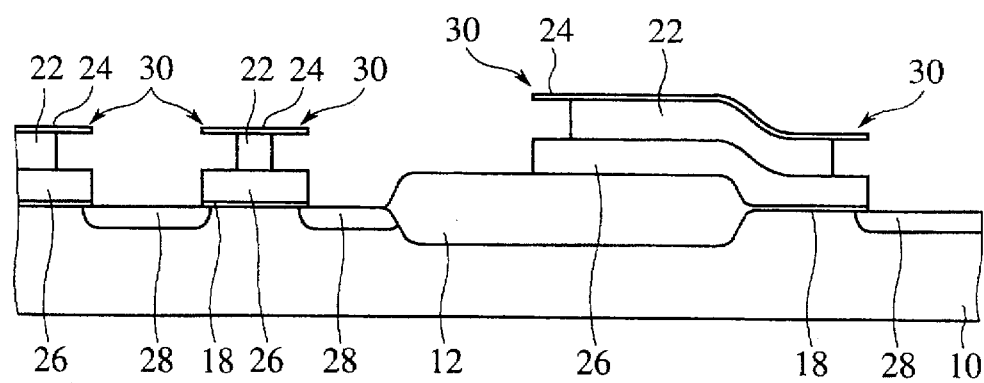

Subsequently, the silicon substrate 10 is immersed in a solution of HF (hydrofluoric acid) or similar solution to isotropically etch the PSG film 22 into a thickness of about 150 nm. The etching advances horizontally in the PSG film 22, and over-hangs 30 of the silicon nitride film 24 are formed (FIG. 2B).

In this etching parts of the gate oxide film 28 and of the device isolation film 12 which are not covered by the gate electrodes 26, are also etched; however, such etching causes no remarkable problems, because the PSG film 22 deposited by plasma CVD has a higher etching rate (by above about 10 times) than the thermal oxide film. It is possible that the gate oxide film 18 and the device isolation film 12 are decreased by less of a degree, by different compositions of the etching solutions and the use of HF vapor. The silicon nitride film 24 is not almost etched by HF solution.

Then, the surface of the silicon substrate 10 is oxidized, by thermal oxidation, to form the silicon oxide film 32 approximately 5 nm thick in a region which is not covered by the gate electrodes 26.

Figure 2C:
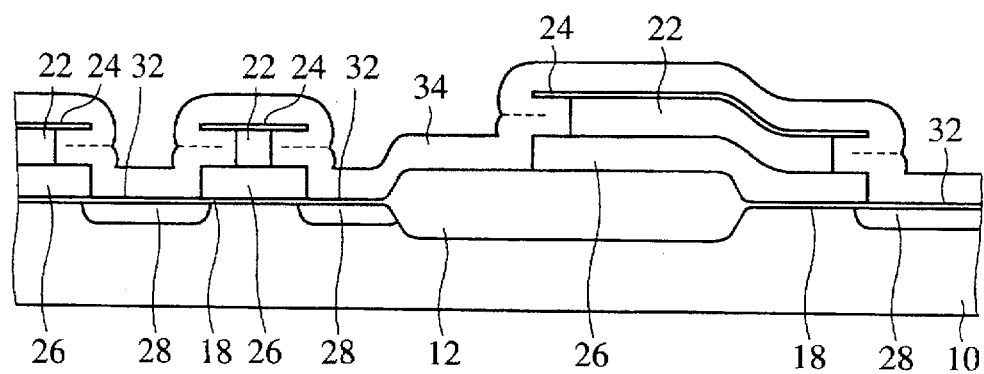

Then, a silicon nitride film 34 approximately 100 nm thick is formed by thermal CVD. The height of the over-hangs, formed by etching the PSG film 22, is determined by the thickness of the PSG film 22. The PSG film 22 has a thickness of 100 nm, and by depositing the silicon nitride film 34 in a film that is 100 nm thick, the over-hangs 30 can be completely buried (FIG. 2C).

Figure 3A:
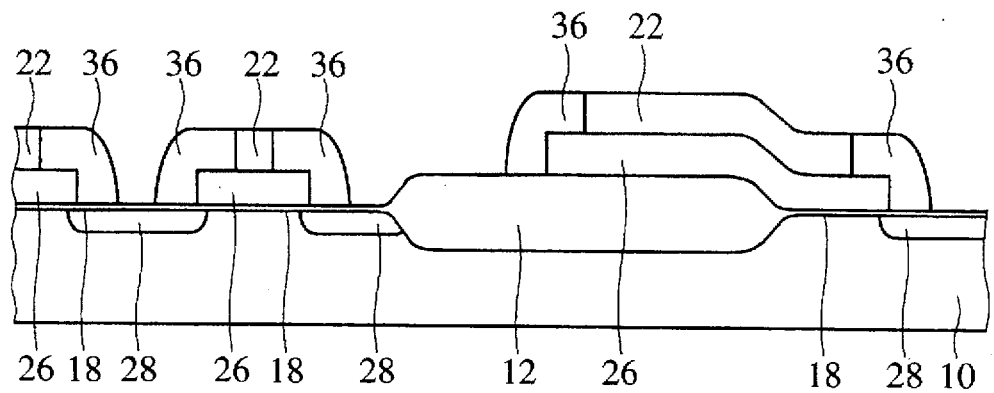
FIGS. 3A and 3B are sectional views of the semiconductor device, according to the first embodiment of the present invention at different steps of the fabrication process of the same, which shows the method (Part 2).

Subsequently the silicon nitride films 34 and 24 are anisotropically etched to form the etching stopper film 36 which covers the side walls of the gate electrodes 26 and extends over the edges of the top surfaces of the gate electrodes 26 by an about 150 nm. The length of that etching stopper film 36 extended, beyond parts of the top surfaces of the gate electrodes 26, is a distance, by which the PSG film 22 has been retrieved during the isotropic etching. (FIG. 3A).

Then, a heavily doped impurity layer (not shown) is formed on the source/drain diffused layer 28 as required. With the etching stopper film 36 and the gate electrodes 26 acting as a mask, As (arsenic) ions (for example), are implanted under the conditions of a 30 keV acceleration energy and a $4\times10^{15}$ cm$^{-2}$ dose. Thus the diffused layer structure of the MOS transistors can be an LDD (Lightly Doped Drain).

Then, a silicon oxide film and a BPSG film are continuously deposited by CVD and have the surfaces planarized by reflow. The inter-layer insulation film 38, of the silicon oxide film and the BPSG film, is formed.

Subsequently a photoresist 40 for forming the through-holes is formed by the usual lithography.

Figure 3B:
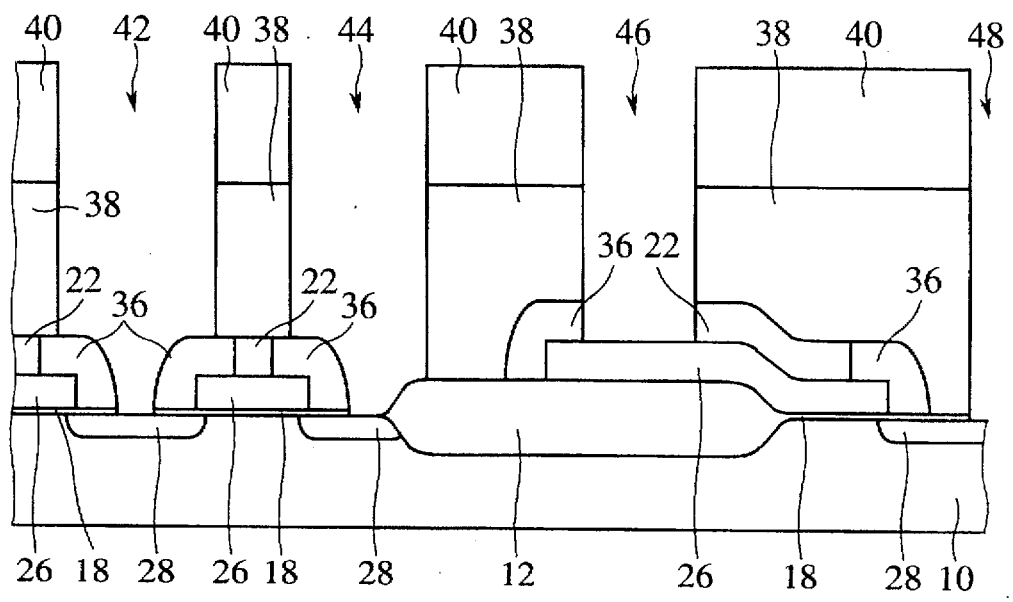

Then, with the photoresist 40 as a mask, the inter-layer insulation film 38 is anisotropically etched to form the through-holes 42, 44, 46, and 48, for exposing the source/drain diffused layer 28 and the gate electrode 26 (FIG. 3B).

At this time, the through-holes 42 and 44 are extended over the gate electrodes 26, but because of the etching stopper film 36 of silicon nitride, covering the side walls and shoulders of the gate electrodes 26, the through-holes can be opened by a self-alignment the same as that of a usual SAC structure.

The through-hole 48 has the usual contact structure which does not use the etching stopper film 36, and can expose the surface of the silicon substrate 10 as in the above-described SAC structure.

The through-hole 46 exposes the gate electrode 26. The etching stopper film 36 is absent on part of the gate electrode in the opening, the PSG film 22 is formed instead. Accordingly, at the time of etching the inter-layer insulation film 38, the base PSG film 22 can be etched. With the formation of the other through-holes, the gate electrode 26 can be exposed simultaneously.

Thus, the through-holes including the SAC can be formed in only one lithography step.

By forming a thin silicon nitride film below the inter-layer insulation film 38, even when the through-holes 42, 44, and 48 are formed on the device isolation film 12 by disalignment etc. in the lithography step, the device isolation film 12 is protected from over-etching.

That is, etching of the inter-layer insulation film 38 is stopped by the silicon nitride film, and then the silicon nitride film is removed to form the through-holes, whereby the over-etching necessary to form the openings in the inter-layer insulation film 38 is not conducted while the device isolation film 12 is exposed, thus film decrease of the device isolation film 12, by the etching of the inter-layer insulation film 38, can be reduced.

Regarding the through-holes 46, it is necessary to further remove the PSG film 22 after the silicon nitride film has been removed. The PSG film 22 can be etched without the lithography step by etching the PSG film 22 under conditions which yield a sufficiently high etching rate with respect to the thermal oxide film, such as the condition of the device isolation film 12.

Thus, according to the present embodiment, the etching stopper film is extended on the side walls of the gate electrodes and on parts of the top surfaces of the gate electrodes by a prescribed distance inward from the peripheral edges, whereby the through-holes of the SAC structure and the through-holes exposing the gate electrode can be formed by one lithography step.

Thus, in comparison with the conventional SAC process, one lithography step can be omitted.

In the present embodiment, the thin silicon nitride film is formed directly below the inter-layer insulation film 38, as a means of reducing the decrease of the device isolation film 12, but other means may also be used. For example, the inter-layer insulation film 38 is formed of a layer of films having different etching characteristics. The films are etched one by one, whereby the amount of over-etching necessary for each of the respective films can be reduced, thus the decrease of the device isolation film 12 can be reduced.

[A Second Embodiment]

The semiconductor device according to a second embodiment of the present invention, and a method for fabricating the same will be explained with reference to FIGS. 4 and 5A–5C. The same members of the present embodiment as the semiconductor device according to the first embodiment and the method for fabricating the same are represented by the same reference numerals not to repeat or simplify their explanation.

Figure 4:
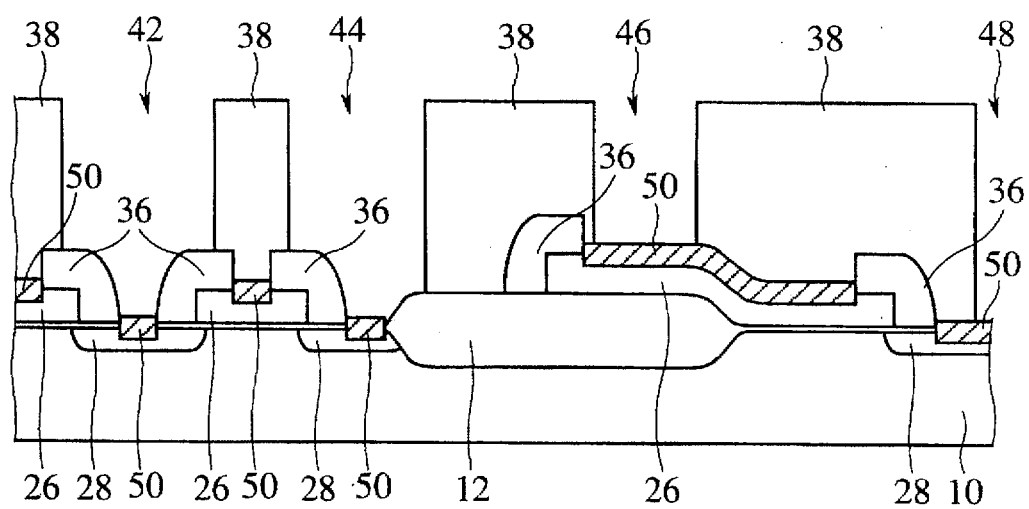
FIG. 4 is a diagrammatic sectional view of the semiconductor device according to a second embodiment of the present invention, which shows a structure thereof.
Figure 5A:
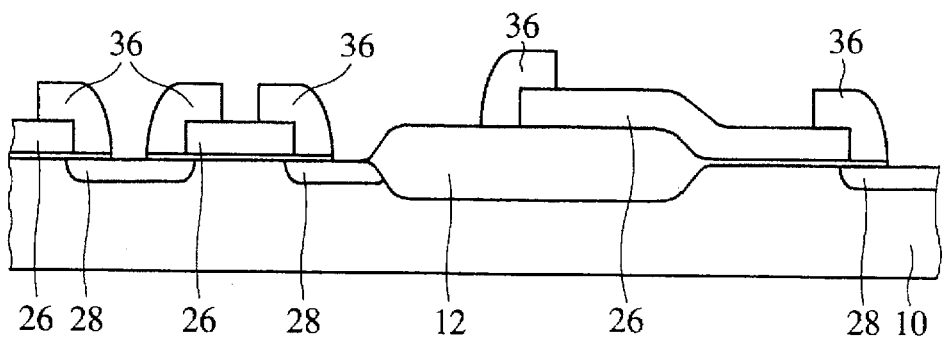
FIGS. 5A–5C are sectional views of the semiconductor device, according to the second embodiment of the present invention at different steps of the fabrication process of the same, which shows the method.
Figure 5B:
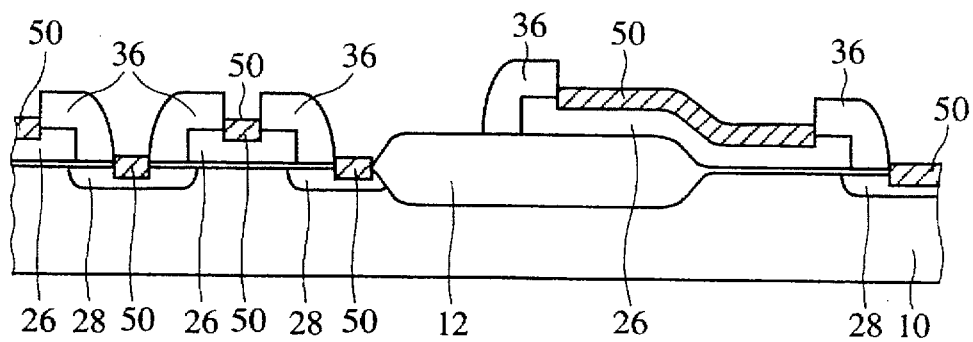
Figure 5C:
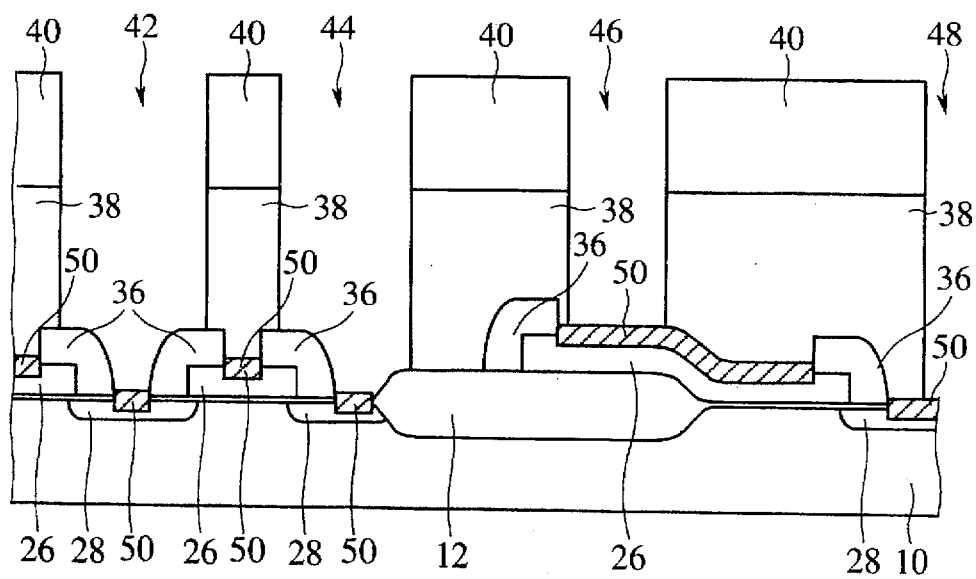

FIG. 4 is a block diagram of the semiconductor device according to the present embodiment, which explains a structure thereof. FIGS. 5A–5C are sectional views of the semiconductor device according to the present embodiment at different steps of the fabrication process of the same, which explain the method.

First, a structure of the semiconductor device according to the present embodiment will be explained with reference to FIG. 4.

The semiconductor device according to the present embodiment has substantially the same basic structure as that according to the first embodiment, but is characterized by a silicide film 50 which is formed by self-alignment on parts of the gate electrodes 26 and on the source/drain diffuse layer 28 on which an etching stopper film 36 is not formed.

This structure of the semiconductor device can decrease diffused layer resistance of the source/drain diffused layer 28 and can improve contact characteristics. The presence of the etching stopper film 36 can improve the reliability of the self-aligned silicide process. An explanation will be provided later.

The method for fabricating the semiconductor device according to the present embodiment will be explained with reference to FIGS. 5A–5C.

Using the same method for fabrication of the semiconductor device according to the first embodiment shown in FIGS. 2A to 3A, MOS transistors, having the etching stopper film 36 covering the side walls of the gate electrodes and parts of the top surfaces of the gate electrodes by a prescribed distance inward, from the peripheral edges are formed.

Then, the MOS transistors are immersed in an HF solution to remove the PSG film 22, and the silicon oxide film 32 on the source/drain diffused layer 28, and parts of the gate electrodes 26 and of the source/drain diffused layer 28 are exposed on the surface (FIG. 5A).

Subsequently a Ti (titanium) film is deposited on the entire surface by sputtering, and is reacted with the exposed parts of the gate electrodes and of the source/drain diffused layer 28 by a thermal treatment, such as RTA (Rapid Thermal Annealing) or others to form a titanium silicide film 50.

Then the unreacted Ti film, on the parts which are not in contact with the silicon, is removed with aqua regia to leave the titanium silicide film 50 only in the set regions on the gate electrodes 26 and of the source/drain diffused layer 28 (FIG. 5B).

The above-described process for selectively forming the titanium silicide film 50 is widely known art as the self-aligned silicide process. However, in the semiconductor device according to the present embodiment, because of the etching stopper film 36 covering the side walls of the gate electrodes 26 and parts of the top surfaces of the gate electrodes by a prescribed distance inward from the peripheral edges, the above-described process can lower probability of short-circuiting the wiring in comparison with the usual self-aligned silicide process.

In the usual self-aligned silicide process, titanium silicide film is selectively formed on the gate electrodes and the source/drain diffused layer, using as a mask the etching stopper film formed only on the side walls of the gate electrodes. If the silicidation horizontally advances because of abnormal reaction in the silicidation, the silicide film on the gate electrode 26 and the silicide film formed on the source/drain diffused layer are short-circuited, resulting in low yields.

However, in the method for fabricating the semiconductor device according to the present embodiment, the etching stopper film 36 is formed on the side walls of the gate electrodes 26 and extended on the shoulders thereof, and the exposed parts of the gate electrodes 26 and the source/drain diffused layer 28 are sufficiently spaced from each other, whereby the silicidation cannot easily advance horizontally. As a result, the probability of the silicide film on the gate electrodes 26 and the silicide film on the source/drain diffused layer 28 short-circuiting with each other can be greatly reduced.

Thus, according to the present embodiment, the etching stopper film, which covers the side walls of the gate electrodes and parts of the top surfaces of the gate electrodes by a prescribed distance inward from the peripheral edges thereof, and has etching characteristics different from the inter-layer insulation film, is formed. The through-holes of the SAC structure and the through-hole exposing the gate electrode can be formed by one lithography step.

With the thus-formed etching stopper film acting as a mask for the reaction, the silicide film is formed by self-alignment on the gate electrodes and the source/drain diffused layer, which can improve fabrication yields in comparison with the conventional self-aligned silicide process.

In the present embodiment, titanium silicide is used as an example, but the self-aligned silicide process may use other silicides of other metals. For example, silicides of metals having high melting points, such as tungsten silicide, molybdenum silicide, cobalt silicide, etc., may be used.

[A Third Embodiment]

The semiconductor device according to a third embodiment of the present invention and the method for fabricating the same will be explained with reference to FIGS. 6 and 7A–7D. The same members of the third embodiment as the semiconductor device according to the first embodiment and the method for fabricating the same are represented by the same reference numerals not to repeat or simplify their explanation.

Figure 6:
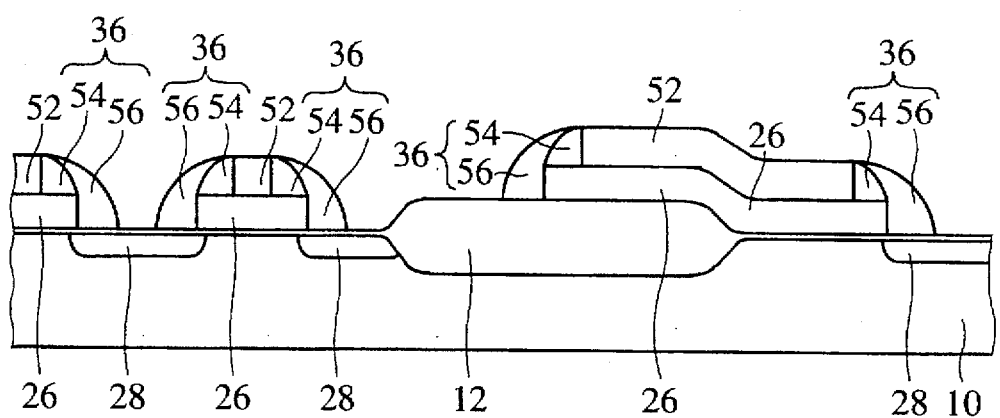
FIG. 6 is a diagrammatic sectional view of the semiconductor device according to a third embodiment of the present invention, which shows a structure thereof.

FIG. 6 is a diagrammatic view of the semiconductor device according to the present embodiment, which shows a structure thereof, and FIGS. 7A–7D are sectional views of the semiconductor device at different steps for fabricating the same, which explain the method.

In the method for fabricating the semiconductor according to the first embodiment shown in FIGS. 1, 2A–2C and 3A–3B, the etching stopper film 36 is formed on the side walls of the gate electrodes 26 and parts of the top surfaces of the gate electrodes by a prescribed distance inward from the peripheral edges thereof, whereby the through-hole 46 exposing the SACs 42, 44, and the gate electrodes 26 can be formed by one lithography step.

To produce the effects of the first embodiment, it is important to form the structure shown in FIG. 3A, but the method for fabricating the structure is not limited to the method for fabricating the semiconductor device according to the first embodiment.

The present embodiment relates to a method for fabricating a semiconductor device equivalent to the semiconductor device according to the first embodiment.

First, a structure of the semiconductor device according to the present embodiment will be explained with reference to FIG. 6.

A silicon oxide film 52 is formed on central parts of the gate electrodes of the MOS transistors. The central parts are spaced a certain distance from the ends of the gate electrodes. Side walls 54 of a silicon nitride film are formed on the side walls of the silicon oxide film 52. Side walls 56 of a silicon nitride film are formed on the side walls of the gate electrodes having their top surfaces covered with the silicon oxide film 52 and the side walls 54. The tops of the side walls 56 reach the side walls of the side walls 54.

Thus a structure which is equivalent to the etching stopper film 36 of the first embodiment shown in FIG. 3A is constituted by the side walls 54 and the side walls 56 formed on the gate electrodes 26.

Then, the method for fabricating the semiconductor device according to the present embodiment will be explained with reference to FIGS. 7A–7D.

First, an approximately 300 nm thick device isolation film 12 is formed, e.g. by the usual LOCOS technique to define device regions 14, 15. Then, a gate oxide film 18 about 10 nm thick is formed in the device regions 14 and 16.

Then, an approximately 200 nm thick polycrystalline silicon film 20, heavily doped with phosphorus, and an approximately 100 nm thick silicon oxide film 52 are deposited respectively, using a CVD technique and a plasma CVD technique.

Figure 7A:
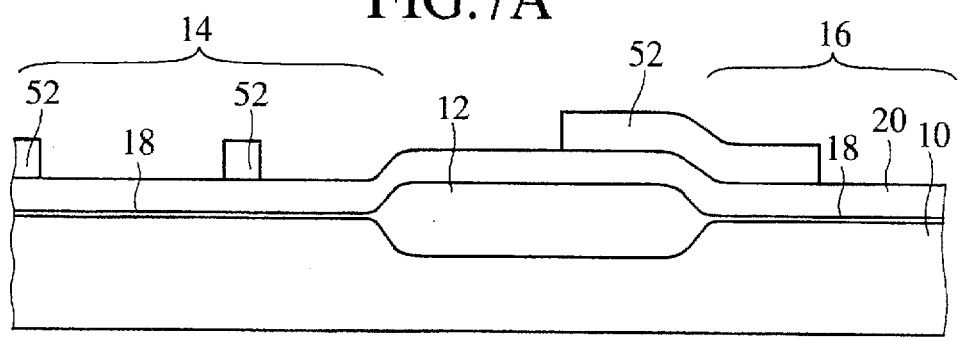
FIGS. 7A–7D are sectional views of the semiconductor device, according to the third embodiment of the present invention at different steps of the fabrication process of the same, which shows the method

Then, the silicon oxide film 52 is patterned by the usual lithography and etching (FIG. 7A). The silicon oxide film 52 defines a pattern of the gate electrodes, which will be formed in a later step. The pattern is processed to be thinner, by a set width, than the pattern of the gate electrodes to be formed. The set width is set to be substantially equal to a width of the side walls 54 to be formed in a later step.

Figure 7B:
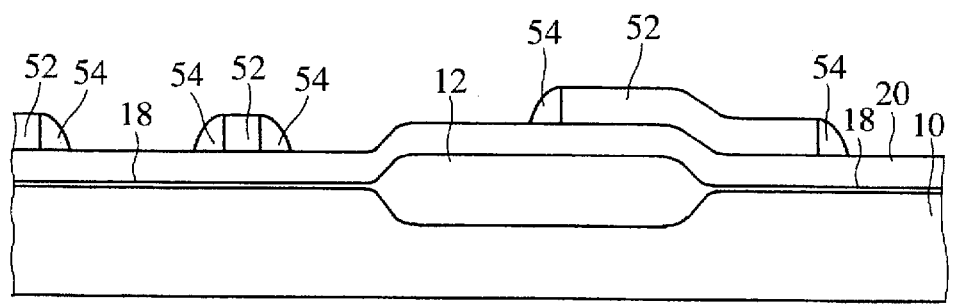

Then, an approximately 100 nm thick silicon nitride film is deposited by a thermal CVD technique and is vertically etched by an RIE technique to form the side walls 54 on the side walls of the silicon oxide film 52 (FIG. 7B).

Next, with the silicon oxide film 52 and the side walls 54 acting as a mask, the polycrystalline silicon film 20 is patterned to form the gate electrodes 26. Because a line width of the gate electrodes 26 is thus determined by a width of the side walls 54 formed on the silicon oxide film 52 and the side walls thereof, it is preferable that film thickness, pattern width, etc. of the silicon oxide film 52 be determined in advance.

Figure 7C:
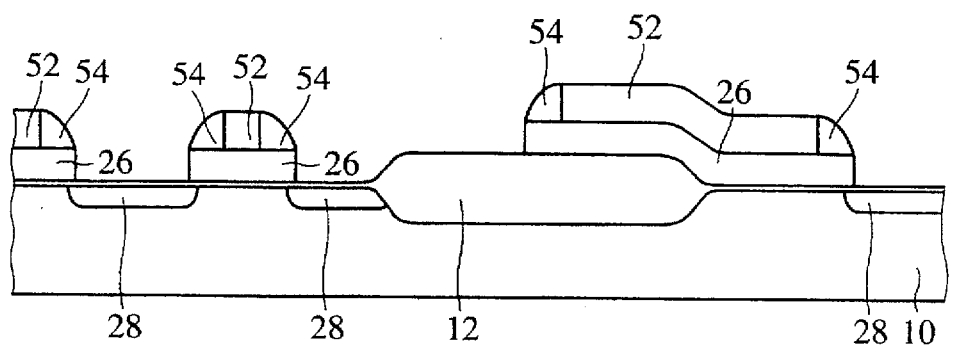

Subsequently with the gate electrodes 26 acting as a mask, the source/drain diffused layer 28 is formed by implanting, for example, P ions under conditions of a 30 keV acceleration energy and a $2\times10^{13}$ cm$^{-2}$ dose (FIG. 7C).

Figure 7D:
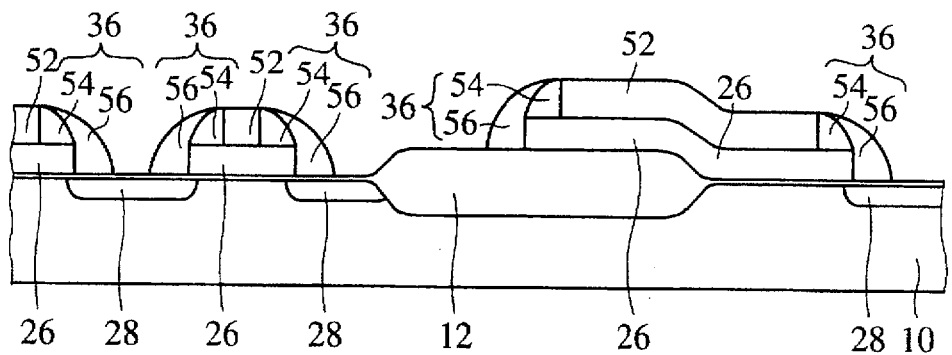

Then, an approximately 100 nm thick silicon nitride film is deposited by a thermal CVD technique and is vertically etched by an RIE technique to form the side walls 56 on the side walls of the gate electrodes 26 and the side walls 54 (FIG. 7D).

As described above, according to the present embodiment, the side walls 54 and the gate electrodes 26 are formed by self-alignment with the silicon oxide film 52, and the side walls 56 are formed by self-alignment with the gate electrodes 26 and the side walls 54, whereby the etching stopper film 36 can be formed on the side walls of the gate electrodes 26 and on parts of the top surfaces of the gate electrodes, which are spaced by a prescribed distance inward from the peripheral edges thereof.

[A Fourth Embodiment]

The semiconductor device according to a fourth embodiment of the present invention and the method for fabricating the same will be explained with reference to FIGS. 8, 9, 10A–10C, 11A–11B, and 12A–12B. The same members of the present embodiment as the semiconductor device according to the first embodiment and the method for fabricating the same are represented by the same reference numerals not to repeat or simplify their explanation.

Figure 8:
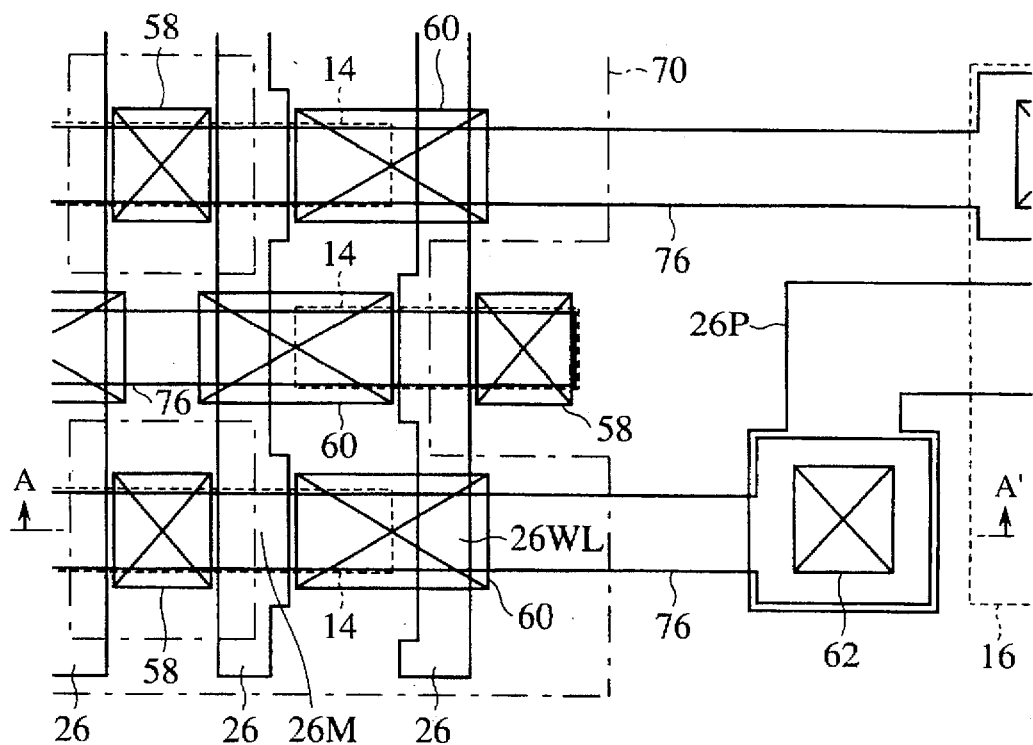
FIG. 8 is a plan view of the semiconductor device, according to a fourth embodiment of the present invention, which shows a structure thereof.
Figure 9:
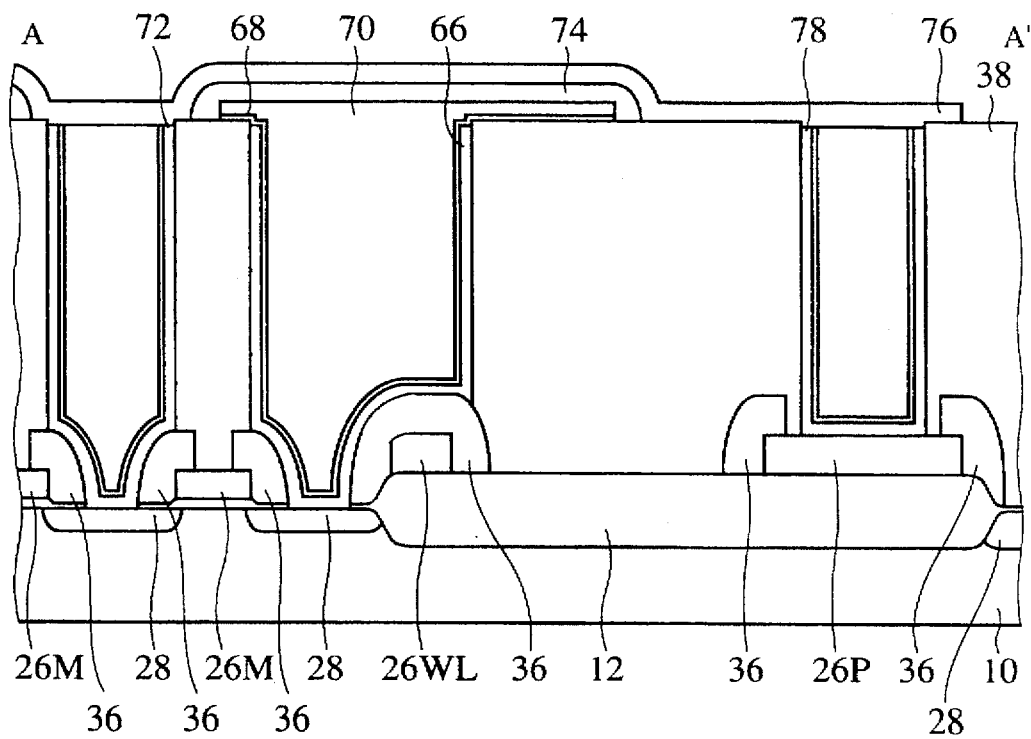
FIG. 9 is a diagrammatic sectional view along the line A-A' of the semiconductor device, according to the fourth embodiment of the present invention shown in FIG. 8.

FIG. 8 is a plan view of the semiconductor device according to the present embodiment, which explains a structure thereof. FIG. 9 is a diagrammatic sectional view along the line A-A' in FIG. 8. FIGS. 10A–10C, 11A–11B, and 12A–12B are sectional views of the semiconductor device according to the present embodiment at the steps of the method for fabricating the same, which explain the method.

In the present embodiment, a case in which the semiconductor device according to the first embodiment and the structure thereof are applied to a DRAM (Random Access Memory) will be explained.

First, the structure of the semiconductor device according to the present embodiment will be explained with reference to FIGS. 8 and 9.

On a silicon substrate 10, device regions 14 and 16 are defined by a device isolation film 12. Gate electrodes 26 are formed in the device regions 14 and 16 independently of one another. A source/drain diffused layer 28 is formed through a gate oxide film 18 in the device region 14 between the gate electrodes 26. Thus memory cell transistors, including the gate electrodes 26 and the source/drain diffused layer 28, are formed.

The gate electrodes formed in the device region 14 are extended normal to the device region 14, and form word lines interconnecting a plurality of memory cell transistors.

The gate electrodes 26 constituting the word lines have different line widths at different locations. The gate electrodes 26 have an approximately 0.2 µm width in the device region 14 (the gate electrodes 26 in the device region 14 are represented by gate electrodes 26M), and the gate electrode has an approximately 0.15 µm width in the other region (the gate electrode in this region is represented by a gate electrode 26WL). The gate electrode in a peripheral circuit region has an approximately 0.5 µm line width (the gate electrode in this region is represented by a gate electrode 26P).

An etching stopper film 36 is formed on the side walls of the gate electrodes 26 and part of the top surfaces of the gate electrodes spaced by a set distance inward from the peripheral edges thereof, and the gate electrodes 26M and 26P have only the end parts of the top surfaces covered with the etching stopper film 36.

An inter-layer insulation film 64, with through-holes 58 and 60 exposing on the source/drain diffused layer 28 and a through-hole 62 exposing on the gate electrode 26P, is formed on the semiconductor substrate 10 on which the memory cell transistors are formed. The through-holes 58 and 60 are formed by self-alignment with the etching stopper film 36.

A capacitor storage electrode 66 is formed on the inside wall of the through-hole 60 and the source/drain diffused layer 28 and is connected to the source/drain diffused layer 28 on the bottom of the through-hole 60. A capacitor dielectric film 58 is formed on the side wall and the top surface of the capacitor storage electrode 66. A capacitor counter-electrode 70 is formed in the through-hole 60 with the capacitor storage electrode 66 and the capacitor dielectric film 68 formed in and on the inter-layer insulation film 64. Thus the capacitor storage electrode 56, the capacitor dielectric 68 and the capacitor counter-electrode 70 constitute a capacitor.

A contact conducting film 72 is formed on the inside wall of the through-hole 58 and the source/drain diffused layer 28 and is connected to the source/drain diffused layer 28 on the bottom of the through-hole 58. The contact conducting film 72 is also connected to bit line 76 arranged across word lines through an inter-layer insulation film 74 formed on the capacitor counter electrode 70, and functions to connect the source/drain diffused layer 28 with the bit line 76.

A contact conducting film 78 is formed on the inside wall of the through-hole 62 and the gate electrodes 26 and is connected to the gate electrode 26 on the bottom of the through-hole 62. The contact conducting film 78 is also connected to the bit lines 76 formed on the inter-layer insulation film 64 and functions to connect the gate electrode 26 with the bit line 76.

Thus, a DRAM comprising 1-transistor and 1-capacitor memory cells is constituted.

The method for fabricating the semiconductor device according to the present embodiment will be explained with reference to FIGS. 10A–10C, 11A–11B, and 12A–12B. This method facilitates the fabrication of the semiconductor device according to the present embodiment.

First, the device isolation film of an approximately 300 nm thick is formed, by e.g. the usual LOCOS technique on the primary surface of the silicon substrate 10 to define the device regions 14 and 16. Then, the gate oxide film 18 approximately 10 nm thick is formed on the device regions 14 and 16 by thermal oxidation.

Then, the polycrystalline silicon film 26 of an approximately 150 nm thick, the PSG film 22 approximately 150 nm thick, and the silicon nitride film 25 of an approximately 20 nm thick are continuously formed by a CVD technique, and then the silicon nitride film 24, the PSG film 22, and the polycrystalline silicon film 20 are simultaneously patterned by the usual lithography and etching. Thus the gate electrodes 26, having the top surfaces covered with the PSG film 22 and the silicon nitride film 24, are formed.

The patterning is conducted so that the gate electrode 26WL has a line width of, e.g. about 0.15 µm, the gate electrode M has a line width of, e.g. about 0.2 µm, and the gate electrode 26P has a line width of, e.g., about 0.5 µm.

Subsequently with the gate electrodes 26 acting as a mask, P ions, for example, are implanted under conditions of a 20 keV acceleration energy and a $2 \times 10^{13}$ cm$^{-2}$ dose to form the source/drain diffused layer 28 in the device region 14 and a lightly doped diffused layer 29 in the device region 16. The lightly doped diffused layer 29 is to be an n⁻layer of a peripheral circuit transistor having an LDD structure.

Then, the silicon substrate 10 is immersed in a diluted HF solution to isotropically etch the PSG film 22 by about 0.08 µm. This etching advances horizontally in the PSG film 22. The PSG film 22 immediately below the gate electrode 26WL having an approximately 0.15 µm thickness is completely etched off. On the other hand, the PSG film 22 on the gate electrode 26M and the gate electrode 26P, whose line width is thicker than the film thickness (0.08×2 µm) to be etched off, is partially left on the gate electrodes 26M, 26P (FIG. 10A).

Figure 10A:
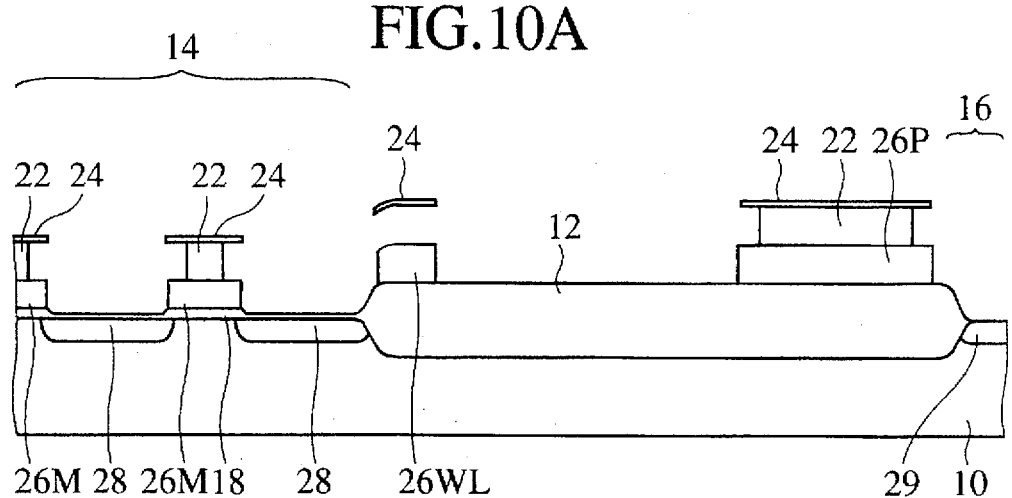
FIGS. 10A–10C are sectional views of the semiconductor device, according to the fourth embodiment of the present invention at different steps of the fabrication process of the same, which shows the method (Part 1).

In FIG. 10A the silicon nitride film 24 on the gate electrode 26WL is apart from the gate electrode 26WL but is supported by the remaining PSG film in the regions of the gate electrodes 26M, which are vertically positioned as viewed in the drawing.

The PSG FILM 22 is thus left on the gate electrode 26P because, as in the method for fabricating the semiconductor device according to the first embodiment, it is convenient to form the through-hole 52.

It is not necessary to leave the PSG film 22 on the gate electrodes 26WL, 26M from the view point of the memory cell regions. However, unless the PSG film 22 is left in the memory cell regions, there is a risk that the silicon nitride film 24 may scatter. Thus it is preferable that the PSG film 22 be left in the memory cell regions.

Figure 10B:
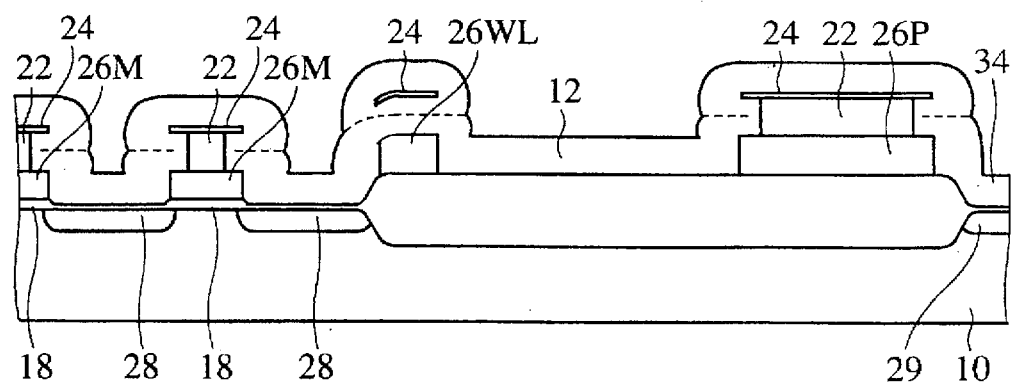

Next, the silicon nitride film 24 approximately 100 nm thick is formed by thermal CVD. The side edges formed by etching the PSG film 22 are completely buried by the silicon nitride film 34 (FIG. 10B).

Then, the silicon nitride films 34 and 24 are anisotropically etched to form an etching stopper film 36 which covers the side walls of the gate electrodes 26 and are extended on parts of the top surfaces of the gate electrodes inward by about 0.08 µm from the peripheral edges thereof. The gate electrode 26WL is completely covered by the etching stopper film 36.

Figure 10C:
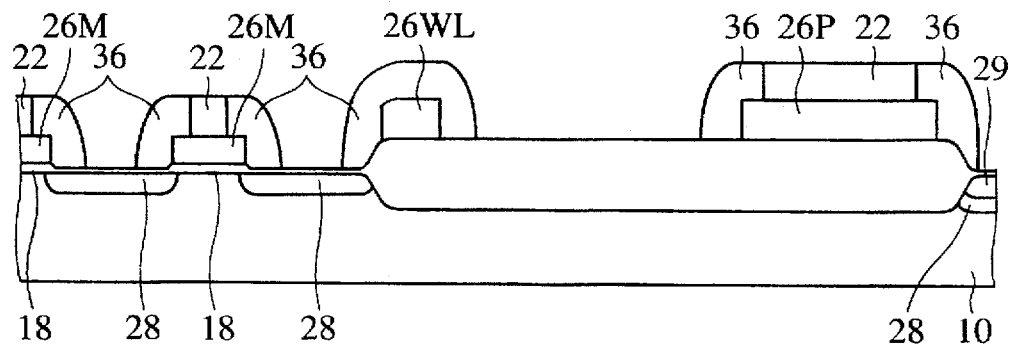

Next, with the etching stopper film 36 acting as a mask, As ions, for example, are implanted in the device region 16 under conditions of a 15 keV acceleration energy and a $4 \times 10^{15}$ cm$^{-2}$ dose, to form the source/drain diffused layer 28 having LDD structure with the lightly doped diffused layer 29 as an n⁻layer (FIG. 10C).

Then, an approximately 50 nm thick silicon oxide film and an approximately 2 μm thick PSG film are continuously deposited, and the surface is planarized by reflow or polishing. Thus the inter-layer insulation film 38, comprising a layer of the silicon oxide film and BPSG film, is constituted.

Figure 11A:
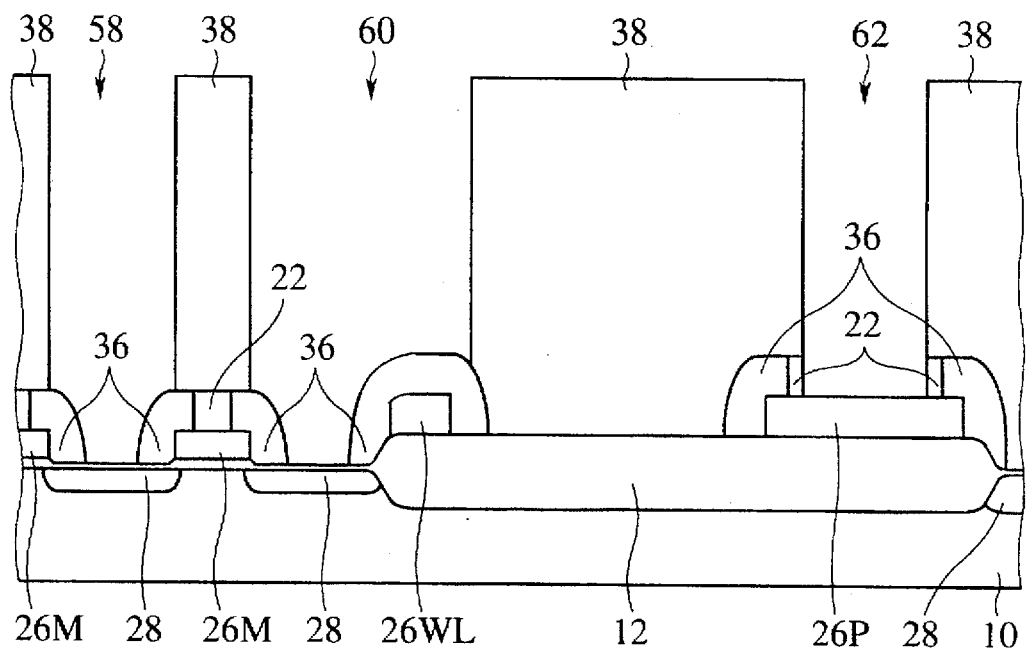
FIGS. 11A and 11B are sectional views of the semiconductor device, according to the fourth embodiment of the present invention at different steps of the fabrication process of the same, which shows the method (Part 2).

Subsequently, the through-holes 58 and 60 exposing the source/drain diffused layer 28 and the through-hole 62 exposing the gate electrodes 26 are formed in the inter-layer insulation film 28 (FIG. 11A).

At this time, because the etching stopper film 36 is not formed on the gate electrodes 26, the gate electrode 26P is exposed in the through-hole 62. On the other hand, the through-holes 58 and 60 are extended onto the gate electrodes 26M and 26WL, the etching stopper film 36 is formed on the gate electrodes 26M and 26WL in this region, the gate electrodes 26M and 26WL are not exposed.

Especially because the gate electrode 26WL is completely covered with the etching stopper film 36, the gate electrode 26WL is not exposed even when the through-hole 60 is formed in the region including the gate electrode 26WL. Accordingly it is possible that the through-hole 60 is extended onto the gate electrode 26WL, and the capacitor having a large area is formed.

In etching the inter-layer insulation film 38, it is preferable that conditions of the etching are set so that the silicon nitride film has a sufficiently low etching rate. This setting effectively suppresses the etching of the etching stopper film 36 on the bottoms of the through-holes 58 and 60, and the through-holes 58 and 60 can be formed by self-alignment without exposing the gate electrodes 26.

Next an approximately 50 nm thick titanium nitride (TiN) film is deposited by a CVD technique, and only the TiN film formed on the inter-layer insulation film 38 is removed by polishing or other means. Thus the contact conducting film 72 formed on the inside wall and bottom of the through-hole 58, the capacitor storage electrode 56 formed on the inside wall and bottom of the through-hole 60, and the contact conducing film 78 on the inside wall and bottom of the through-hole 62, are formed.

Figure 11B:
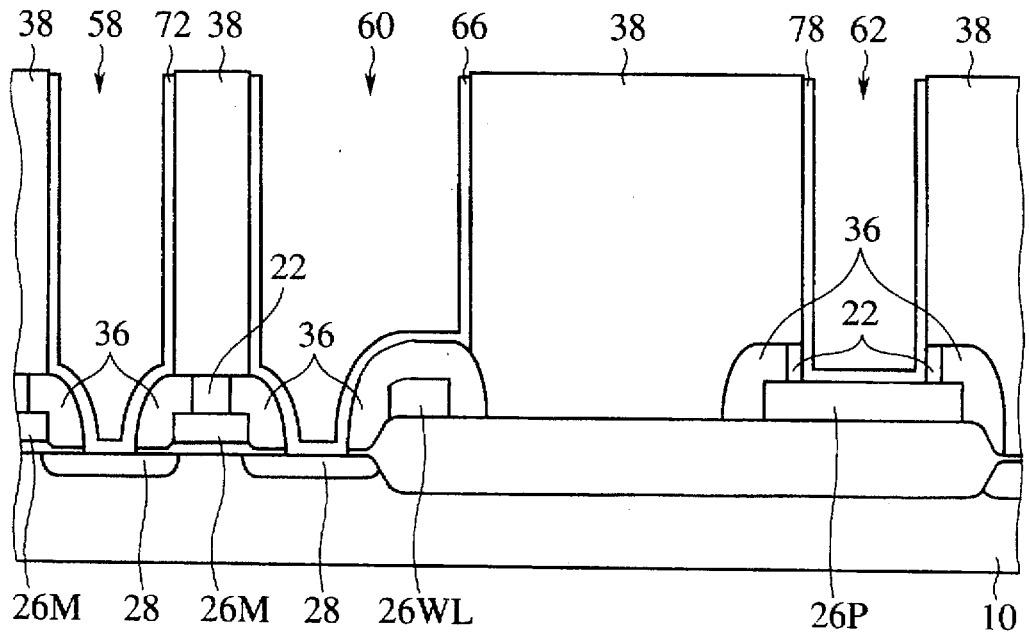

The contact conducting film 72 and the capacitor storage electrode 66 are connected to the source/drain diffused layer 28 on the bottoms of the through-holes 58 and 60. The contact conducting film 78 is connected to the gate electrode 26P on the bottom of the through-hole 62 (FIG. 11B).

Next, an approximately 15 nm thick Ta$_2$O$_5$ film (tantalic oxide film), an approximately 100 nm thick TiN film and an approximately 100 nm thick silicon oxide film are continuously formed respectively by a CVD technique, a CVD technique and a plasma CVD technique, and are processed in the same pattern by the usual lithography and etching.

Thus the capacitor dielectric film 68 of the TaO$_5$ film, the capacitor opposed electrode 70 of the TiN film, and the inter-layer insulation film 74 of the silicon oxide film, are formed.

Figure 12A:
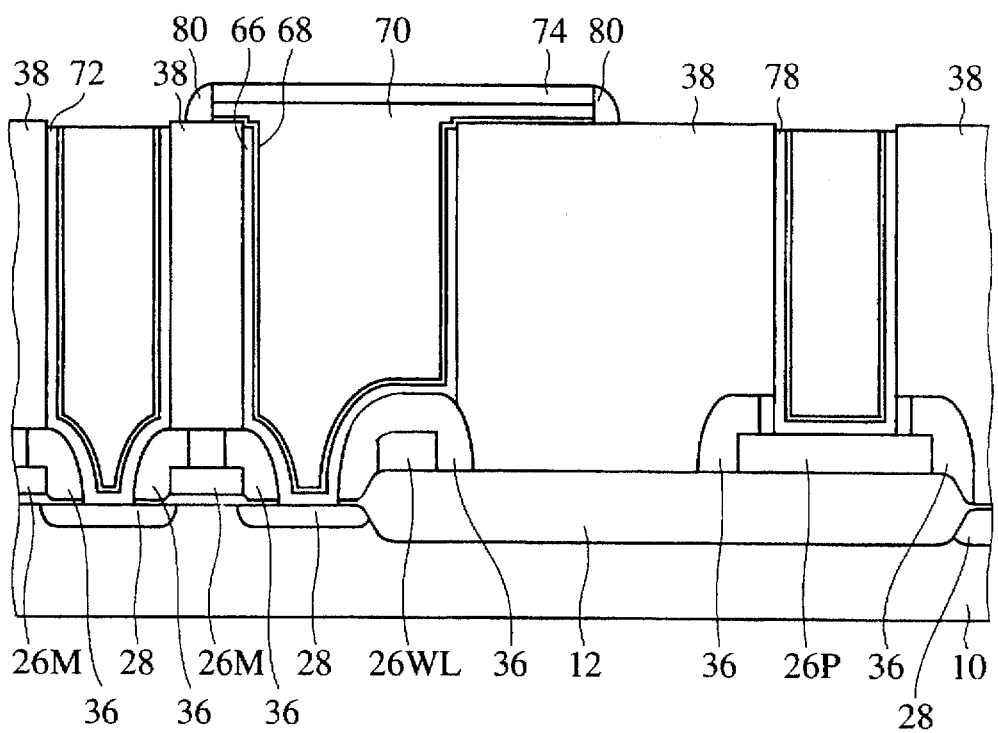
FIGS. 12A and 12B are sectional views of the semiconductor device, according to the fourth embodiment of the present invention at different steps of the fabrication process of the same, which shows the method (Part 3).

Subsequently an approximately 100 nm thick silicon oxide film is deposited by plasma CVD and anisotropically etched to form the side wall insulation film 80 on the side walls of the capacitor opposed electrode 70 and the inter-layer insulation film 74 (FIG. 12A).

Then, an approximately 100 nm thick TiN film is deposited by a CVD technique and is patterned by the usual lithography and etching to form the bit line 76. The bit line 76 is connected to the source/drain diffused layer 28 through the contact conducting film 72 and to the gate electrode 26P through the contact conducting film 78.

Figure 12B:
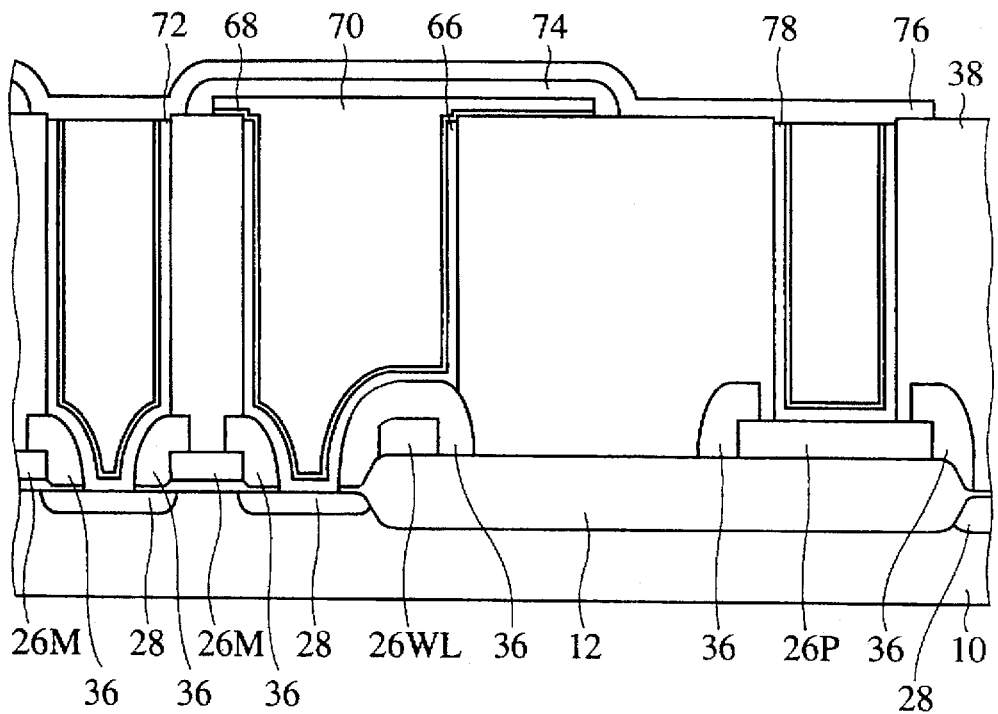

Thus a DRAM comprising 1-transistor and 1-capacitor memory cells is constituted (FIG. 12B).

As described above, according to the present embodiment, the semiconductor device according to the first embodiment and the method for fabricating the same are applied to a DRAM, whereby the through-holes of SAC structure, and the through-hole opened on the gate electrode can be formed by one lithography step. The fabrication process of the DRAM can be simplified while the through-holes can be easily formed.

The line width of the gate electrodes constituting the word lines can be varied in the regions of the gate electrodes, whereby the gate electrode 26 completely covered with the etching stopper film 36, and the gate electrodes 26M having the edges alone covered with the etching stopper film 36 can be formed.

As a result, the through-hole extended onto the gate electrode 26WL is formed without exposing the gate electrode 26WL, whereby the capacitor extended onto the gate electrode 26M can have a large area.

In the present embodiment, the through-holes 58 and 60 having an SAC structure and exposing the source/drain diffused layer 28, and the through-hole exposing the gate electrode 26P are formed, but usual through-holes which have no SAC structure can also be opened.

In the present embodiment, the etching stopper film is formed by the method for fabricating the semiconductor device according to the first embodiment, but may be formed by the method for fabricating the semiconductor device according to the third embodiment.

As in the second embodiment, a self-aligned silicide process may be added.

[A Fifth Embodiment]

The semiconductor device according to a fifth embodiment of the present invention and the method for fabricating the same will be explained with reference to FIGS. 13, 14, and 15A–15D. The same members of the present embodiment as the semiconductor device according to the first to the fourth embodiments of the present invention and the method for fabricating the same are represented by the same reference numerals not to repeat or simplify their explanation.

Figure 13:
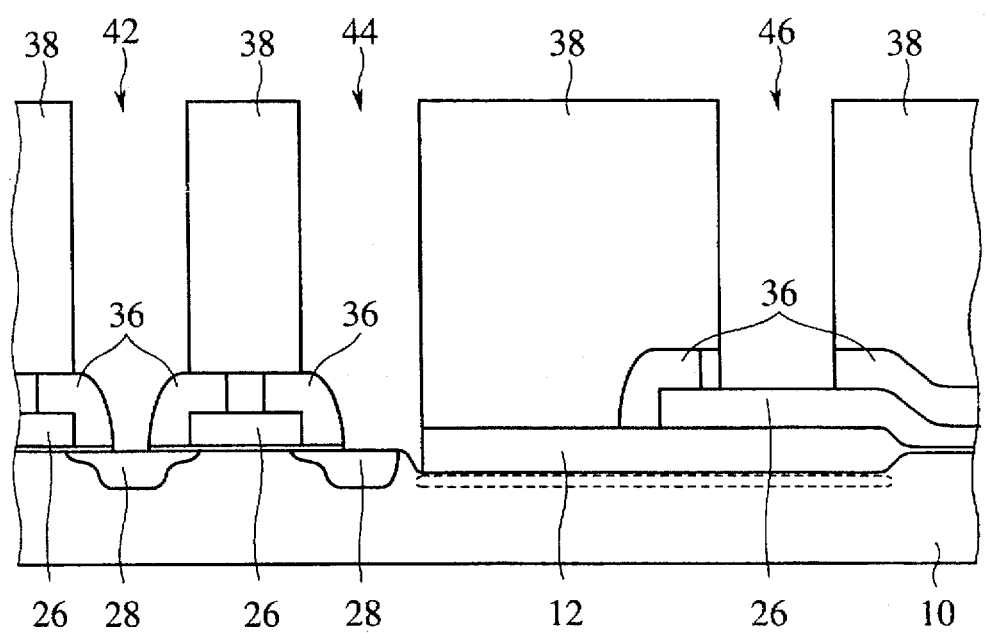
FIG. 13 is a view explaining the disadvantages of the fabrication process of the semiconductor device, according to the first to the fourth embodiments of the present invention.
Figure 14:
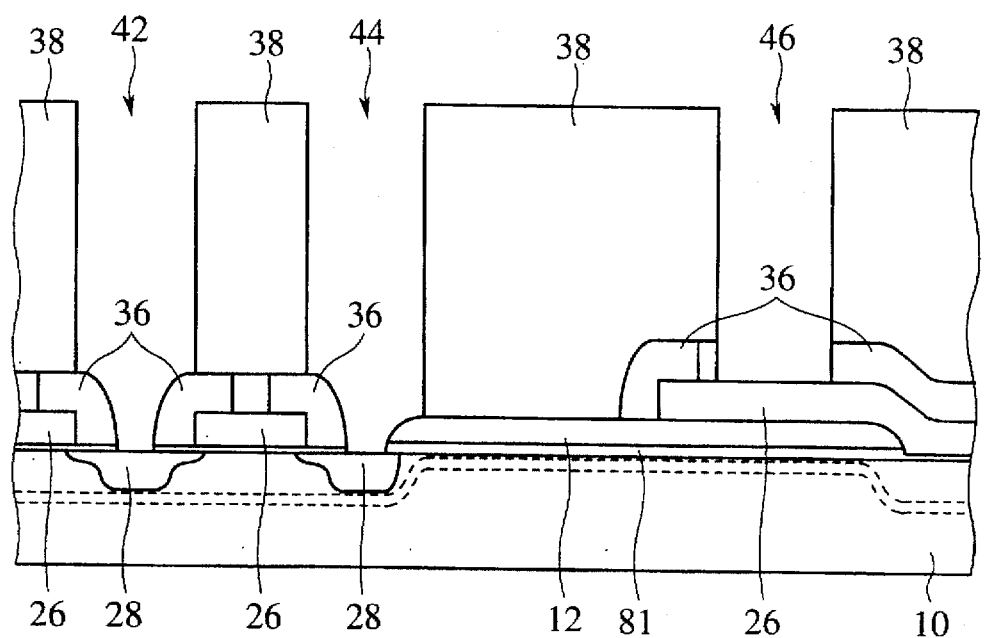
FIG. 14 is a diagrammatic sectional view of the semiconductor device, according to a fifth embodiment of the present invention, which shows a structure thereof.

FIG. 13 is a view explaining a disadvantage of the method for fabricating the semiconductor device according to the first to the fourth embodiments of the present invention. FIG. 14 is a diagrammatic sectional view of the semiconductor device according to the present embodiment, which shows a structure thereof. FIGS. 15A–15D are sectional views of the semiconductor device according to the present embodiment at the steps of the method for fabricating the same, which explain the method.

In semiconductor device according to the first to the fourth embodiments and the method for fabricating the same, the typical LOCOS technique is exemplified as a method for forming the device isolation film. When using LOCOS technique however, the device isolation film 12 is formed by oxidizing the base silicon substrate 10, which prohibits the use of an insulation film other than an oxide film.

On the other hand, in many cases, the inter-layer insulation film 38 is provided by a silicon oxide film or a silicon oxide film containing impurities having good alignment, etc. with silicon process, and in etching through-holes to be formed in the inter-layer insulation film 38, the silicon oxide film and the doped silicon oxide film have a higher etching rate while the silicon nitride film has a lower etching rate.

In such cases, when a through-hole is formed on the device isolation film 12 due to displacement of the lithographic disalignment, etc., as shown in FIG. 13, there occurs a risk that the device isolation film 12 exposed in the through-hole 44 may be etched when etching the inter-layer insulation film 38, and the silicon substrate 10, in the region where the source/drain diffused layer 26 is not formed, may be exposed.

When a wiring layer (not shown), of e.g. Al (aluminum) is formed in the region where the device isolation film 12 has been etched, the wiring layer and the silicon substrate 10 short-circuit each other. Accordingly, control of the etching of the inter-layer insulation film 38 needs to be precise. Impurity ions are implanted in the exposed silicon substrate 10 to compensate contact.

The inconvenience of the device isolation film 12 being etched can be eliminated by forming a thin silicon nitride film just below the inter-layer insulation film 38, as exemplified in the first embodiment, but undesirably adds to the number of steps.

The semiconductor device according to the present embodiment, and the method for fabricating the same can eliminate this inconvenience without complicating the fabrication process.

First, the semiconductor device according to the present embodiment and the method for fabricating the same will be explained with reference to FIG. 14.

The semiconductor device according to the present embodiment is characterized by a provision of a device isolation film 12 by a silicon nitride film 82 formed on a silicon substrate 10 through a silicon oxide film 81. This structure of the semiconductor device permits the stopping of the etching process with good selectivity for the base.

The method for fabricating the semiconductor device according to the present embodiment will be explained with reference to FIGS. 15A–15D.

First, the silicon substrate 10 is thermally oxidized to form an approximately 15 nm thick silicon oxide film 81 on the entire surface.

Figure 15A:
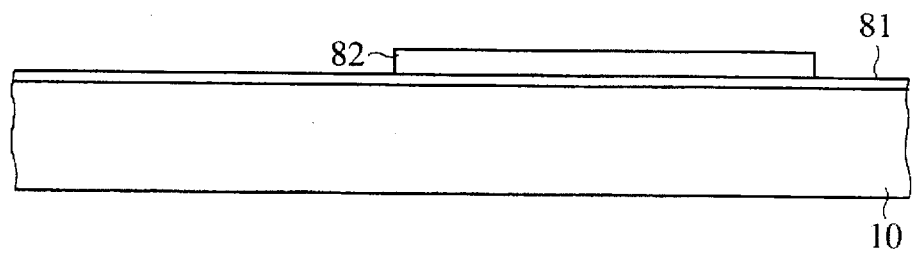
FIGS. 15A–15D are sectional views of the semiconductor device, according to the fifth embodiment of the present invention at different steps of the fabrication process of the same, which shows the method.

Then, the silicon nitride film 82 is deposited in an approximately 200 nm thickness by a CVD technique and processed into a required pattern. The silicon nitride film 82 is patterned to remain in the device isolation region (FIG. 15A).

Figure 15B:
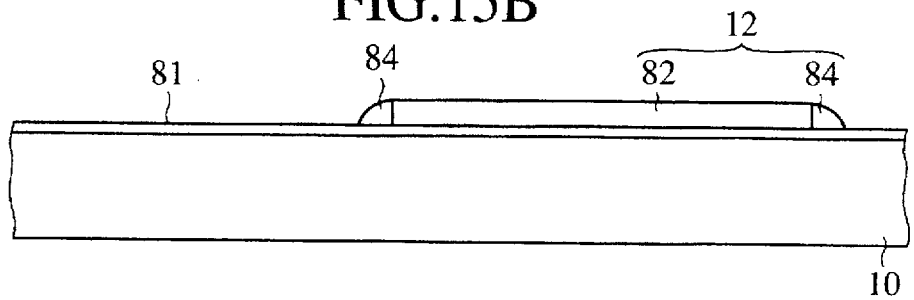

Subsequently the silicon nitride film is deposited in an approximately 100 nm thickness by a CVD technique and is then anisotropically etched to form the side wall nitride film 84 on the side walls of the silicon nitride film 82 (FIG. 15B). The side wall nitride film 84 is not essential, but it is preferred to form a smooth step at the edge of the silicon nitride film 82.

Thus the formed silicon nitride film 82 and the side wall nitride film 84 constitute the device isolation film 12.

Figure 15C:
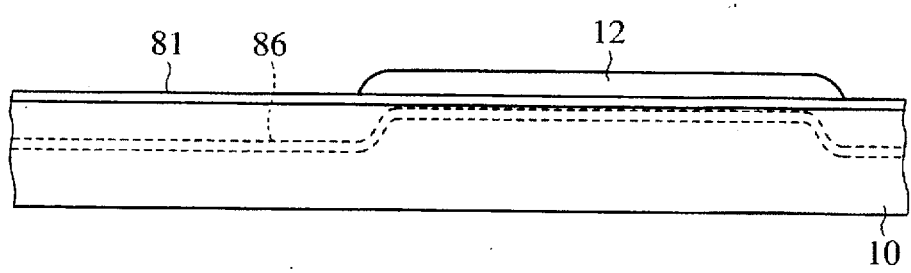

Then, B (boron) ions for example, are implanted, under conditions of a 180 keV acceleration energy and a $5 \times 10^{12}$ $cm^{-2}$ dose, to form a channel stop doped layer 89. Because of the channel stop doped layer 86 formed in this way, it is possible that a parasitic transistor formed in the device isolation region can have a sufficiently high threshold voltage (FIG. 15C).

Then, a MOS transistor is formed in the device regions 14 and 16 in the same way as the semiconductor device, according to the first embodiment shown in FIGS. 2A to 3B, and the inter-layer insulation film 38 with the through-holes 42, 44, 46 formed thereon is formed.

Figure 15D:
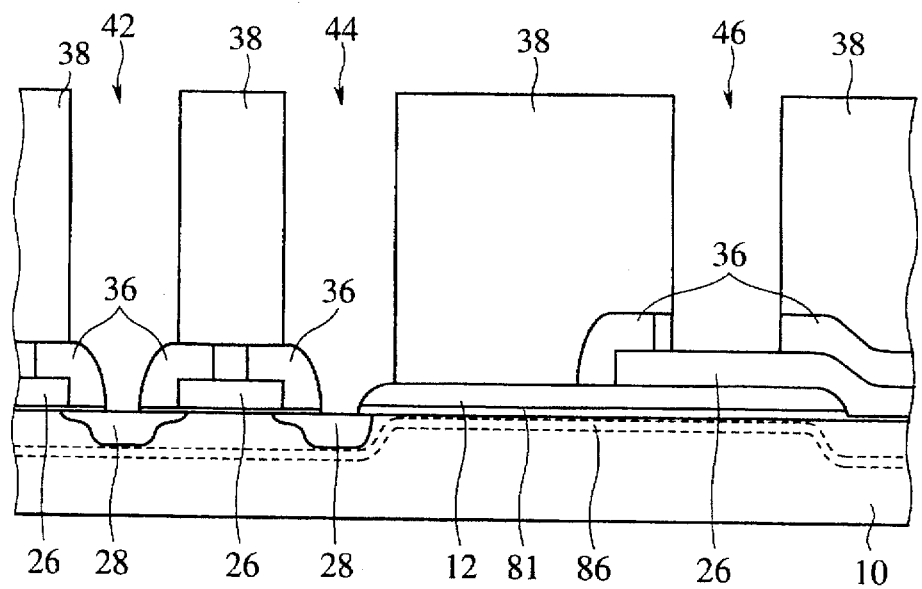
Figure 16:
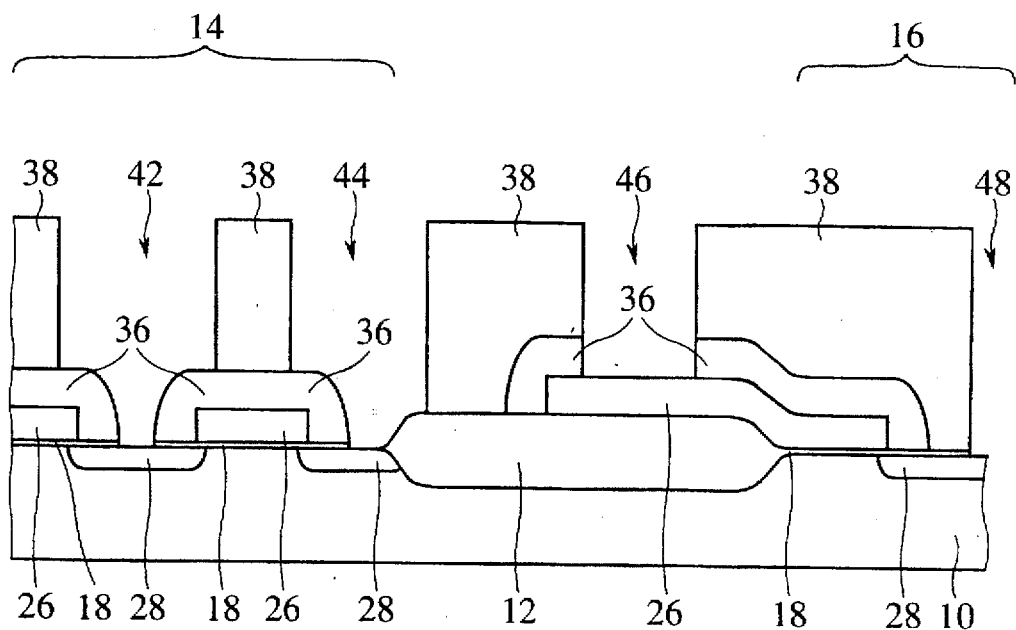
FIG. 16 is a sectional view of a conventional semiconductor device.
Figure 17A:
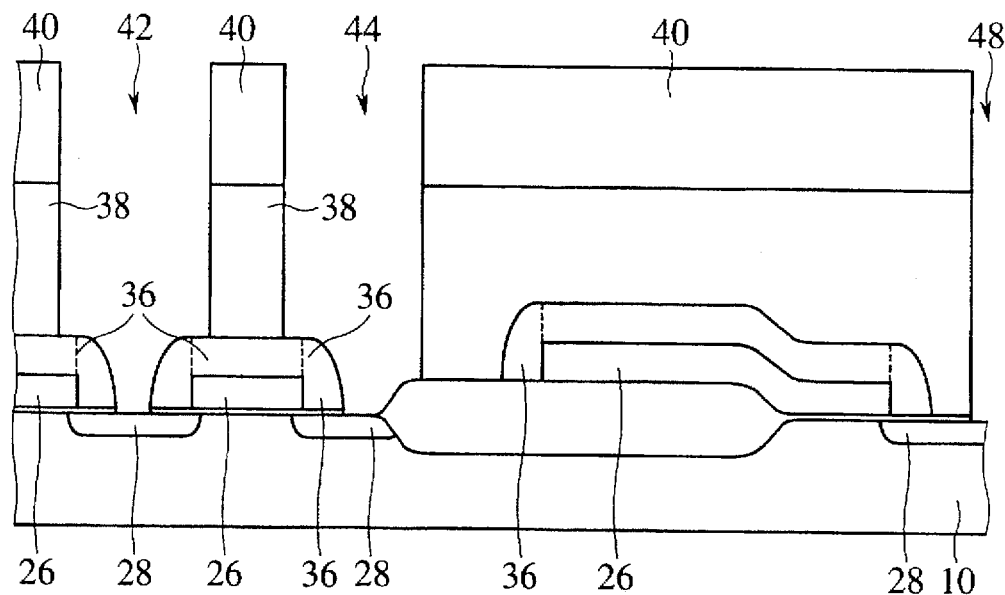
FIGS. 17A and 17B are sectional views of the conventional semiconductor device at different steps of the fabrication process of the same, which shows the method.
Figure 17B:
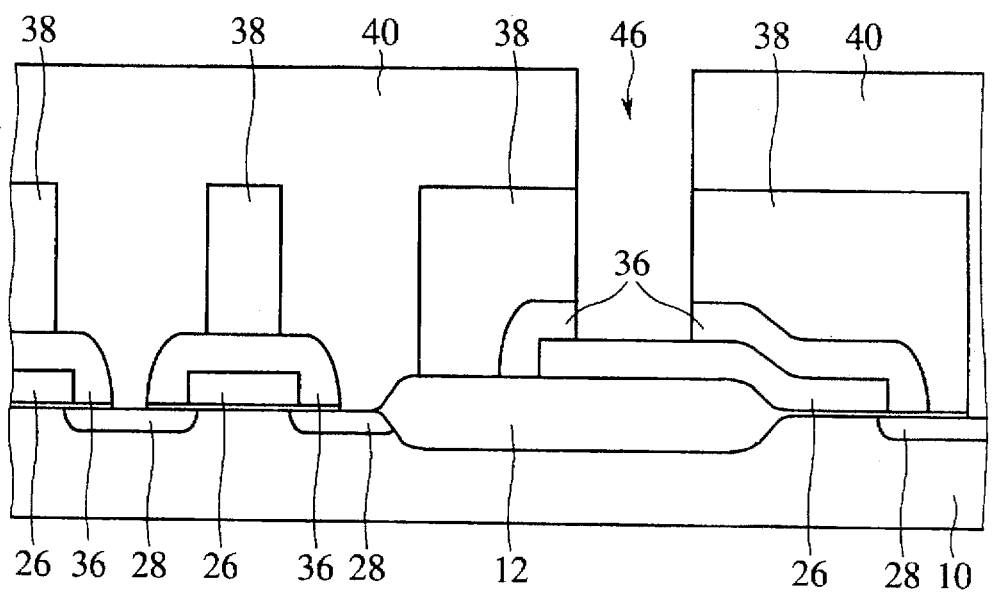

In the present embodiment, even in the case in which the device isolation film 12 is exposed in the through-hole 44, the device isolation film 12 is not etched at the time of the through-hole etching because the device isolation film 12 is formed of the silicon nitride film 82 (FIG. 15D).

Accordingly the silicon substrate 10 immediately below the device isolation film 12 is not exposed in the through-hole etching, and a short-circuit between the wiring layers, which are to be formed in a later step with the silicon substrate 10, can be prevented.

As described above, according to the present embodiment, the device isolation film of the silicon nitride film is formed on the silicon substrate, whereby even in a case in which the through-holes and the device isolation film overlap each other, the device isolation film is prevented from etching when forming the through-holes.

Furthermore, the silicon substrate in the region where the diffused layer is not formed is prevented from being exposed in the through-holes, so that when the wiring layer is formed in the through-holes in a later step, a short-circuit between the silicon substrate and the wiring layer can be prevented.

The above-described method for forming the device isolation film has substantially the same number of steps as the LOCOS technique. Without adding to the total number of fabrication steps, the above-described effect can be attained.

In the present embodiment, the device isolation film 12 is provided by silicon nitride film, but it is preferred that the device isolation film 12 be formed of the same insulating material as the etching stopper film 36. This makes it possible, even in a case in which the device isolation film 12 is exposed in the through-holes, for the through-holes to be formed in the etching stopper film 36 and the device isolation film 12 by self alignment.

In the present embodiment, the inter-layer insulation film 38 is formed of silicon oxide film, but if it is possible to form the inter-layer insulation film 38 of a different insulating material, having high etching selectivity with respect to silicon oxide film, the device isolation film 12 can be provided by an oxide film formed by the LOCOS technique. In this case, the etching stopper film 36 is formed of silicon oxide film, whereby the through-holes can be formed in the inter-layer insulation film 38 with the device isolation film 12 and the etching stopper film 36 acting as a mask.

What is claimed is:

1. A semiconductor device comprising:

a semiconductor substrate;

a device isolation film defining a device region on the semiconductor substrate;

a pair of diffused layers formed in the device region;

a gate electrode formed through a first insulation film on the semiconductor substrate between the pair of the diffused layers;

an etching stopper film covering side walls of the gate electrode and a part of a top surface of the gate electrode which is extended inward by a prescribed distance from peripheral edges thereof; and a second insulation film formed at least on the top surface of gate electrode not covered by the etching stopper film thereon.

2. A semiconductor device according to claim 1, wherein the second insulation film is extended over the etching stopper film and the semiconductor substrate, and has a first through-hole formed on one of the pair of diffused layers and a second through-hole formed on the gate electrode not covered by the etching stopper film formed thereon, and further comprising a wiring layer connected to one of the pair of diffused layers or the gate electrode through the first through-hole or the second through-hole.

3. A semiconductor device according to claim 1, further comprising:

a metal silicide film formed on the top surface of the gate electrode not covered by the etching stopper film formed thereon, and on one of the pair of diffused layers.

4. A semiconductor device according to claim 2, further comprising:

a metal silicide film formed on the top surface of the gate electrode not covered by the etching stopper film formed thereon, and on pair of diffused layers.

5. A semiconductor device according to claim 1, wherein the device isolation film is formed of the same material as the etching stopper film.

6. A semiconductor device according to claim 4, wherein the device isolation film and the etching stopper film are formed of silicon nitride film.

7. A semiconductor device comprising:

a device isolation film defining a device region on a semiconductor substrate;

a word line extended in a first direction on the semiconductor substrate;

a bit line extended in a second direction intersecting the first direction on the semiconductor substrate; and a memory cell disposed in a region of an intersection between the word line and the bit line on the semiconductor substrate, the memory cell including:

a pair of diffused layers formed in the device region;

a gate electrode forming the word line formed on the device region between the pair of the diffused layers through a first insulation film, and extending on the device isolation film; and an etching stopper film covering side walls of the gate electrode and a part of a top surface of the gate electrode which is extended inward by a prescribed distance from peripheral edges thereof; and a second insulation film formed at least on the gate electrode not covered by the etching stopper film formed thereon.

8. A semiconductor device according to claim 7, wherein the gate electrode formed on the device region has a larger line width than the gate electrode formed on the device isolation film.

9. A semiconductor device according to claim 7, wherein the etching stopper film has a region covering an entire surface of the gate electrode.

10. A semiconductor device according to claim 8, wherein the etching stopper film has a region covering an entire surface of the gate electrode formed on the device isolation film.

* * * * *